(12) United States Patent
Honda et al.

(10) Patent No.: US 8,130,545 B2
(45) Date of Patent: Mar. 6, 2012

(54) NONVOLATILE SEMICONDUCTOR STORAGE DEVICE

(75) Inventors: Yasuhiko Honda, Hiratsuka (JP); Takahiro Suzuki, Chigasaki (JP); Masao Iwamoto, Yokohama (JP); Kiyochika Kinjo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/938,435

(22) Filed: Nov. 3, 2010

(65) Prior Publication Data

US 2011/0055465 A1 Mar. 3, 2011

Related U.S. Application Data

(62) Division of application No. 12/272,161, filed on Nov. 17, 2008, now Pat. No. 7,843,728.

(30) Foreign Application Priority Data

Nov. 20, 2007 (JP) .................................. 2007-300779
Aug. 27, 2008 (JP) .................................. 2008-218153

(51) Int. Cl.
*G11C 11/34* (2006.01)
*G11C 16/04* (2006.01)
(52) U.S. Cl. ............................ 365/185.03; 365/189.02
(58) Field of Classification Search ............. 365/185.03, 365/189.02, 230.03
See application file for complete search history.

(56) References Cited

U.S. PATENT DOCUMENTS 6,353,553 B1 * 3/2002 Tamada et al. ........... 365/185.03
(Continued)

FOREIGN PATENT DOCUMENTS

JP 2001-210082 8/2001
(Continued)

*Primary Examiner* — VanThu Nguyen
(74) *Attorney, Agent, or Firm* — Oblon, Spivak, McClelland, Maier & Neustadt, L.L.P.

(57) ABSTRACT

A nonvolatile semiconductor storage device capable of storing a plurality of bits of data in one memory cell by assigning multivalued data having a higher-order bit selected from one of a pair of data in a first unit and a lower-order bit selected from the other of the pair of data to each threshold voltage of the memory cell, wherein in a first write operation that processes data in the first unit, the logic of one of the higher-order bit and the lower-order bit is fixed, and two pieces of multivalued data that maximize the difference between the threshold voltages are assigned, thereby storing one bit of input data in the one memory cell in a pseudo binary state, and in a second write operation that processes data in a second unit larger than the first unit, a plurality of bits of input data is stored in the one memory cell in a multivalued state, and parity data for error correction in the second unit is stored in the memory cell.

11 Claims, 22 Drawing Sheets

U.S. PATENT DOCUMENTS

| | | |
|---|---|---|
| 6,801,468 B1 | 10/2004 | Lee |
| 7,698,615 B2 * | 4/2010 | Kang et al. .................. 714/746 |
| 7,768,828 B2 * | 8/2010 | Lee ........................ 365/185.03 |
| 7,978,513 B2 * | 7/2011 | Kasuga .................. 365/185.03 |
| 2006/0181934 A1 | 8/2006 | Shappir et al. |

FOREIGN PATENT DOCUMENTS

| | | |
|---|---|---|
| JP | 2005-108303 | 4/2005 |

* cited by examiner

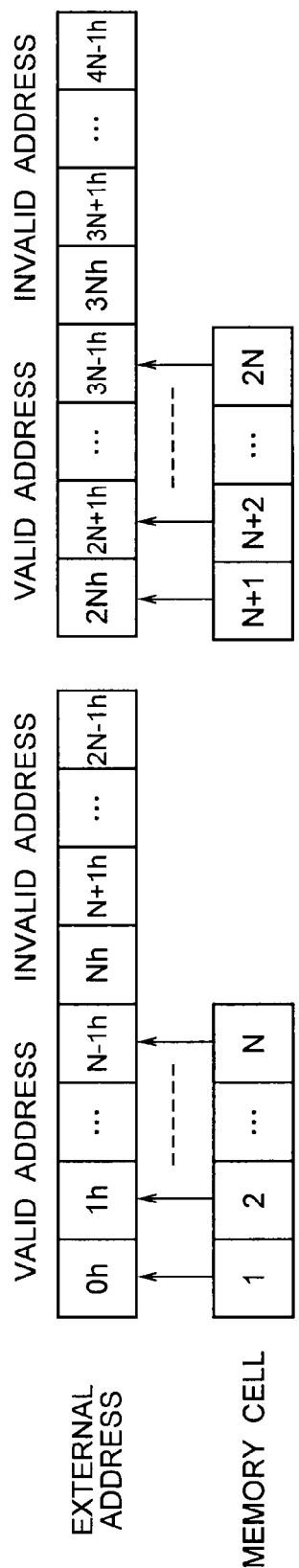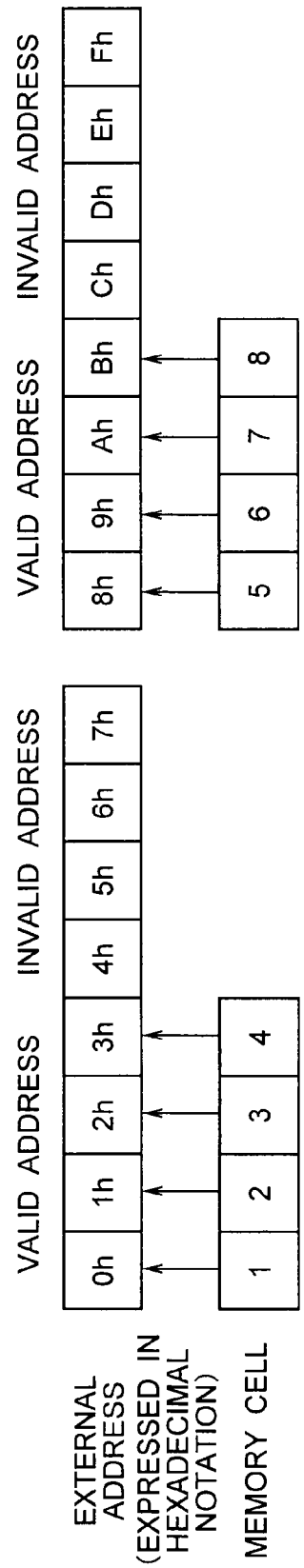
FIG.14A
FIG.14B

NONVOLATILE SEMICONDUCTOR STORAGE DEVICE

CROSS-REFERENCE TO RELATED APPLICATION

This application is a divisional of U.S. application Ser. No. 12/272,161 filed Nov. 17, 2008, and is based upon and claims the benefit of priority from the prior Japanese Patent Applications No. 2007-300779, filed on Nov. 20, 2007, and No. 2008-218153, filed on Aug. 27, 2008, the entire contents of each of which are incorporated herein by reference.

BACKGROUND OF THE INVENTION

1. Field of the Invention

The present invention relates to a nonvolatile semiconductor storage device. For example, it relates to a flash memory that has a memory cell capable of storing multivalued data.

2. Background Art

In general, a nonvolatile semiconductor storage device, such as a NOR flash memory, performs the word write operation in which the memory cells are written in units of one word (16 bits) and the page write operation in which the memory cells are written in units of a plurality of words to reduce the write time.

Recently, flash memories having greater capacities have been manufactured at lower costs, and the multivalued technique for storing a plurality of bits of data in a single memory cell has also progressed (see Japanese Patent Laid-Open No. 2005-108303, for example).

If the NOR flash memory has multivalued memory cells, the number of words that can be written in one page write operation is 512, which is significantly greater than 8, 16 or 32, which are the numbers of words that can be written according to conventional techniques. This is due to the increase in write speed and adoption of the error-correcting code (ECC) to improve the reliability, for example (see Japanese Patent Laid-Open No. 2001-210082, for example).

SUMMARY OF THE INVENTION

According to one aspect of the present invention, there is provided: a nonvolatile semiconductor storage device capable of storing a plurality of bits of data in one memory cell by assigning multivalued data having a higher-order bit selected from one of a pair of data in a first unit and a lower-order bit selected from the other of the pair of data to each threshold voltage of the memory cell, wherein in a first write operation that processes data in the first unit, the logic of one of the higher-order bit and the lower-order bit is fixed, and two pieces of multivalued data that maximize the difference between the threshold voltages are assigned, thereby storing one bit of input data in the one memory cell in a pseudo binary state, and in a second write operation that processes data in a second unit larger than the first unit, a plurality of bits of input data is stored in the one memory cell in a multivalued state, and parity data for error correction in the second unit is stored in the memory cell.

According to the other aspect of the present invention, there is provided: a nonvolatile semiconductor storage device, comprising: a plurality of memory cells capable of reading and writing of data; a flag storing part that stores flag data indicating which of multivalued data writing and binary data writing is performed for each predetermined cell region, which constitutes a part of the plurality of memory cells; and an access range setting part that permits access to the whole of the corresponding cell region based on an external address in a case where the flag data indicates the multivalued data writing and permits access to a half of the corresponding cell region based on successive external addresses in an address range in a case where the flag data indicates the binary data writing.

BRIEF DESCRIPTION OF THE DRAWINGS

FIG. 14A is a diagram showing a relationship between external addresses and memory cells in the case where the SLC mode is selected;

FIG. 14B shows an example in which "N" shown in FIG. 14A is 4 (N=4);

DETAILED DESCRIPTION

For example, thresholds of a memory cell are assigned to different values of multivalued data in such a manner that a data value (11) represents the erased state, and the remaining thresholds are successively assigned to data values (10), (00) and (01) in ascending order of threshold level. The intervals between the adjacent thresholds of the memory cell that stores multivalued data has to be controlled to be narrower than the interval between the thresholds of the memory cell that stores binary data.

Therefore, the reliability of the multivalued data stored in the memory cell is typically ensured by providing the multivalued data with parity data and using an ECC circuit. When the multivalued date is written, in order to improve the efficiency of parity data relief or to reduce the write time, the page write operation has to be used to perform a batch processing of a large amount of data, such as 512 words (8192 bits) of data.

In the page write operation, for example, body data of 512 words, parity data associated with the body data, and flag data described later are written to memory cells as a unit. In the case where the page write operation is performed on memory cells that store multivalued data, body data of 512 words (8192 bits) are stored and held in 4096 memory cells.

On the other hand, in the case where the word write operation in which data is processed in units of one word is performed in a multivalued mode, the IO compressing method in which data is compressed in units of one word in a closed manner is used as a data compressing method for multivalued data. In the case where parity data is generated for every body data of 512 words described above, the parity data has to be updated each time one word of data is added.

However, typical flash memories are configured to have a data erase unit greater than the data write unit and therefore have a problem that the parity data cannot be updated as described above when writing is performed in units of one word.

Nonvolatile semiconductor storage devices according to embodiments of the present invention, which are aspects of the present invention, solve the problem described above and store pseudo binary data or multivalued data in memory cells according to the unit of writing.

In the following, embodiments of the present invention will be described with reference to the drawings. The nonvolatile semiconductor storage devices particularly described in the following embodiments are NOR flash memories.

Embodiment 1

Figure 1:
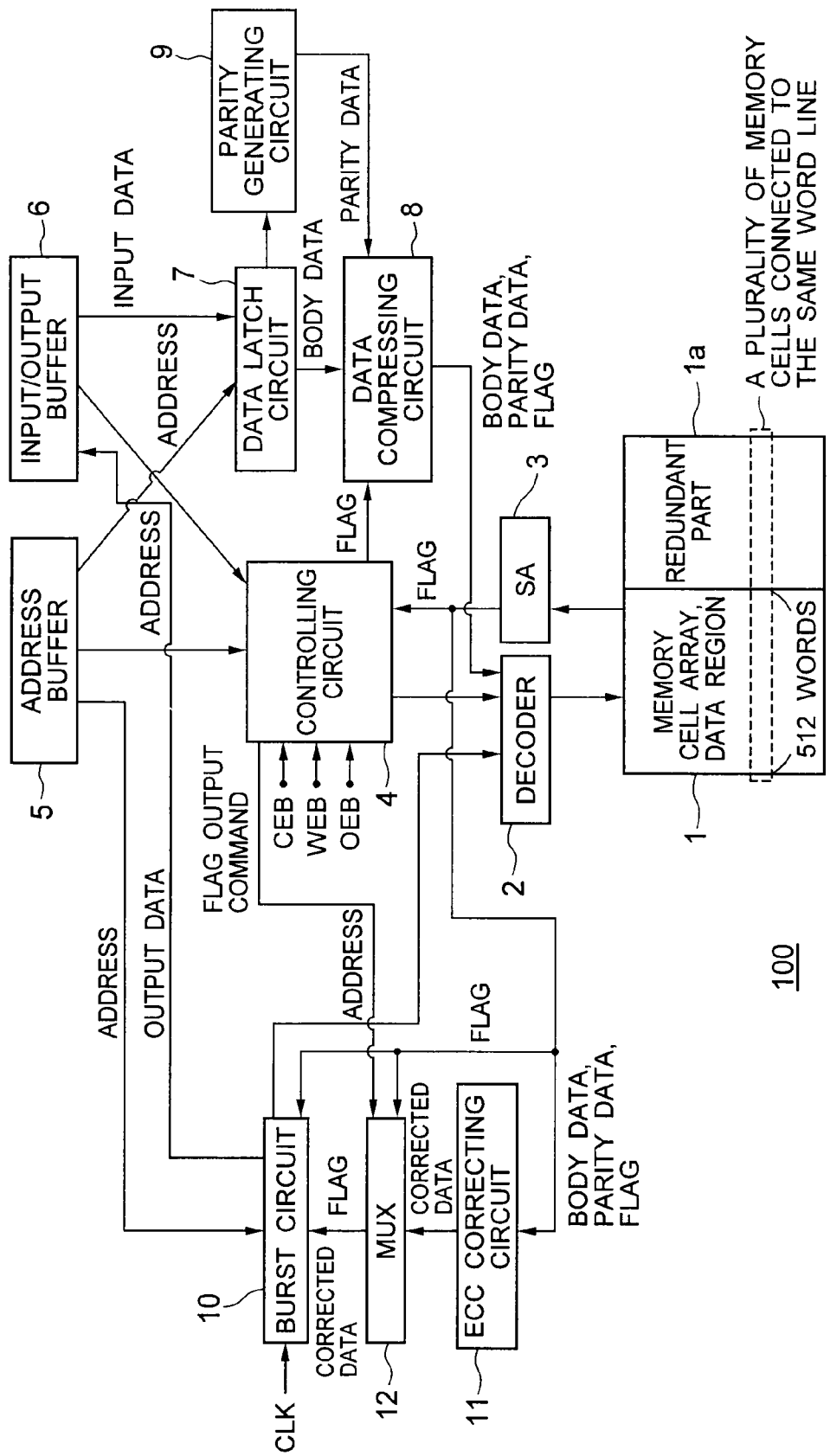
FIG. 1 is a diagram showing a configuration of a NOR flash memory 100 according to an embodiment 1 of the present invention, which is an aspect of the present invention.

FIG. 1 is a diagram showing a configuration of a NOR flash memory 100 according to an embodiment 1 of the present invention, which is an aspect of the present invention.

As shown in FIG. 1, the NOR flash memory 100 has a memory cell array 1, a decoder 2, a sense amplifier 3, a controlling circuit 4, an address buffer 5, an input/output buffer 6, a data latch circuit 7, a data compressing circuit 8, a parity generating circuit 9, a burst circuit 10, an ECC correcting circuit 11, and a multiplexer 12.

The memory cell array 1 has a plurality of memory cells arranged in a matrix. Control gate electrodes of a plurality of memory cells arranged in a selection row are commonly connected to a word line, and drain regions of a plurality of memory cells arranged in a selection column are commonly connected to a bit line via a bit line contact.

The group of memory cells connected to one word line include a plurality of memory cells used as data regions for storing body data (externally input write data) and a plurality of memory cells used as a redundant part (parity/flag region) 1a for storing parity data and flag data described later associated with the body data. In this embodiment, the group of memory cells connected to one word line described above is assumed as a unit of the page write operation.

In the following, the term "word write operation" means a batch processing operation of input data of 16 bits (a first write operation), and the term "page write operation" means a batch processing operation of input data of a plurality of words or, in other words, of at least 2 words (32 bits) or more (a second write operation), for example.

The decoder 2 selects and drives a bit line and a word line in the memory cell array 1 in response to a control signal output from the controlling circuit 4.

The sense amplifier 3 is connected to the bit lines of the memory cell array 1, reads data from the memory cells and outputs the read data.

The address buffer 5 externally receives an address signal and generates an internal address signal. The internal address signal generated by the address buffer 5 is supplied to the controlling circuit 4, the data latch circuit 7 and the burst circuit 10.

The input/output buffer 6 is connected to a data input/output terminal (not shown) capable of inputting and outputting 16 bits (one word) of data in one transfer cycle, for example, and supplies the externally supplied data to the data latch circuit 7 and the controlling circuit 4 when data is written. When data is read, the input/output buffer 6 receives the read data via the burst circuit 10 and externally outputs the received data The controlling circuit 4 receives a chip enable signal "CEB", a write enable signal "WEB" and an output enable signal "OEB", which are externally input, and receives the internal address signal and a data signal. Based on these input signals, the controlling circuit 4 outputs various kinds of control signals for controlling the operation of the internal circuits.

The data latch circuit 7 receives the internal address signal and the input data signal, latches the input data in a region designated by the internal address signal and outputs the latched input data to the data compressing circuit 8 and the parity generating circuit 9. The data latch circuit 7 can hold at least 256 bits of data, for example.

The data compressing circuit 8 address-compresses flag data output from the controlling circuit 4, the body data output from the data latch circuit 7 and the parity data output from the parity generating circuit 9 when a multivalued data is written to a memory cell. In this example, an address compressing method in which data in units of one word input in different transfer cycles are processed as a set (multivalued compression pair) is used.

Figure 2:
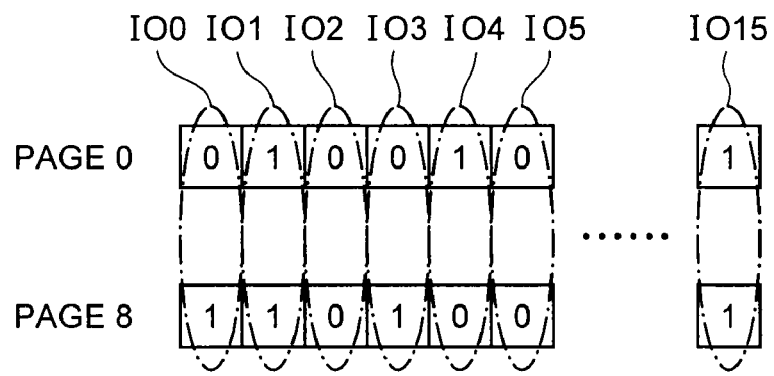
FIG. 2 is a diagram for illustrating the address compressing method used in the embodiment 1.
Figure 3A:
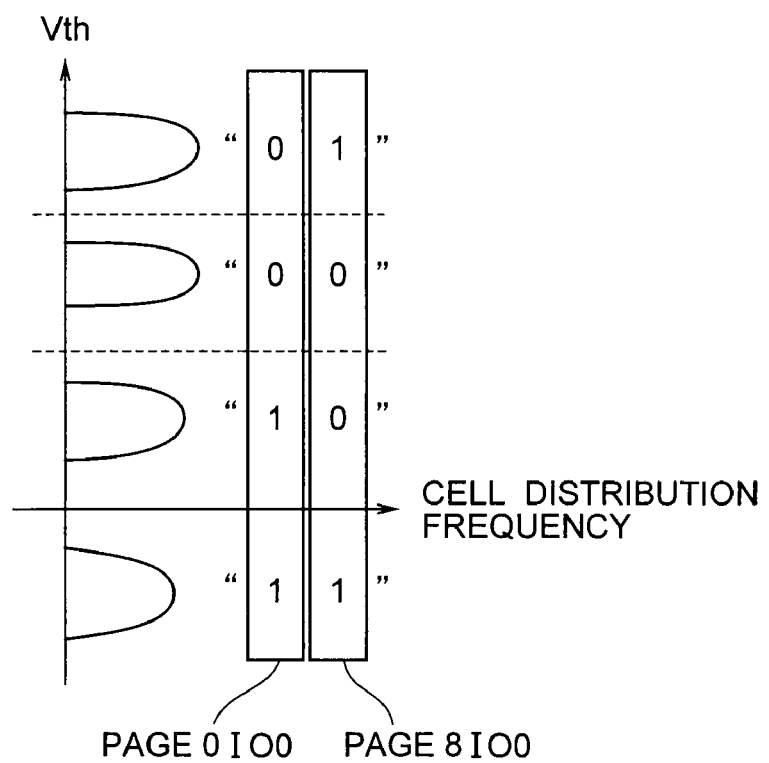
FIG. 3A is a diagram showing a relationship between each threshold of a memory cell to which compressed multivalued data is assigned and a cell distribution frequency.

FIG. 2 is a diagram for illustrating the address compressing method used in the embodiment 1. FIG. 3A is a diagram showing a relationship between each threshold of a memory cell to which compressed multivalued data is assigned and a cell distribution frequency.

In the embodiment 1, as a multivalued data compressing method, the address compressing method in which data in units of one word input in different transfer cycles are processed as a set (multivalued compression pair) is used, rather than the IO compressing method in which data is processed in units of one word in a closed manner. Here, as an example, it will be considered a case where the multivalued compression pair is formed in units of 256 bits. Then, multivalued data "mn" is formed by taking the first 128 bits (8 words) of 256 bits of input data held in the data latch circuit 7 as higher-order bit data ("m" data (m=0, 1)) and taking the second 128 bits (8 words) of the input data as lower-order bit data ("n" data (n=0, 1)).

In the following, in the page write operation, the words forming the higher-order bit data in the input data are referred to as pages 0, 1, . . . , 7. On the other hand, the words forming the lower-order bit data in the input data are referred to as pages 8, 9, . . . , 15. Each page has a data capacity of 16 bits (1 word).

The pages 0 to 7 in the higher-order bit data and the pages 8 to 15 in the lower-order bit data are paired according to the position in the data to form multivalued compression pairs. For example, the page 0 and the page 8 are paired to form a multivalued compression pair. Similarly, the page 1 and the page 9 are paired to form a multivalued compression pair, and the page 2 and the page 10 are also paired to form a multivalued compression pair.

Each of the pages of the multivalued compression pair, such as the page 0 and the page 8, is 16-bit data and composed of 16 binary bits IO<0>, IO<1>, . . . , IO<15>. Here, the expression "IO<i>" (i=0, . . . , 15) means a binary bit input via an i-th input/output terminal.

For example, data located at the same IO address IO<i> in the two pages forming the multivalued compression pair (the page 0 and the page 8, for example) are associated with each other as shown in FIG. 2 and assigned to each threshold of a memory cell, thereby storing multivalued data (FIG. 3A).

Two pages forming a multivalued compression pair are not necessarily in the relationship described above, and any different pages can be paired into a multivalued compression pair. Furthermore, it is essential only that bits in different pages are compressed, so that data located at different IO addresses may be associated with each other.

Figure 3B:
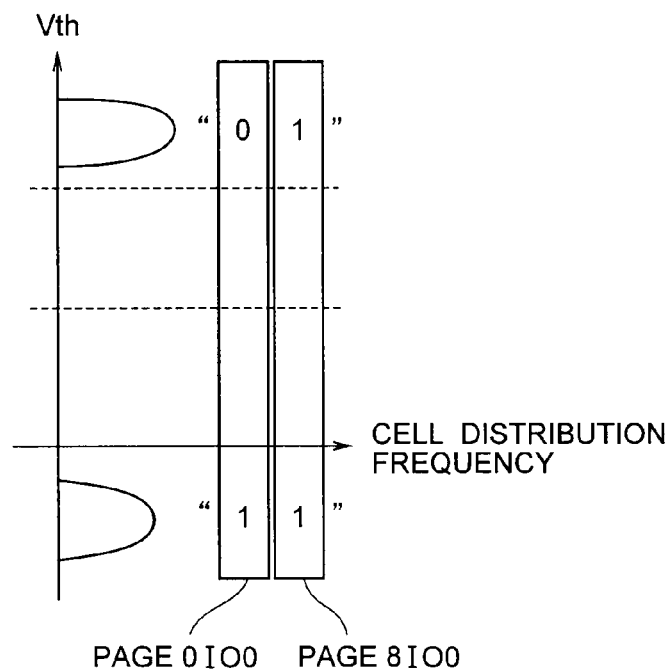
FIG. 3B is a diagram showing a relationship between each threshold of a memory cell to which compressed pseudo binary data is assigned and a cell distribution frequency.
Figure 3C:
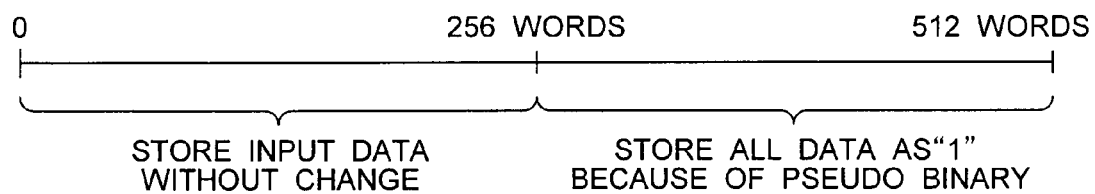
FIG. 3C is a diagram showing assignment of data written in the word write operation.

FIG. 3B is a diagram showing a relationship between each threshold of a memory cell to which compressed pseudo binary data is assigned and a cell distribution frequency. FIG. 3C is a diagram showing assignment of data written in the word write operation.

In the embodiment 1, in data writing in units of one word, two states of (11) and (01) for which the difference in threshold voltage is maximized are used, and pseudo binary data is written to the memory cell (FIG. 3B). In this case, the data reliability is assured without generating parity data.

In writing of the pseudo binary data, for example, the bit IO<0> of the page 8 in the lower-order bit data is forcedly fixed to "1" so that (11) data or (01) data (binary data) is written to the memory cell depending on the bit IO<0> of the page 0. That is, for example, the lower-order bit data composed of the pages 8 to 15 is forcedly fixed to "1" regardless of the external input. As a result, the actually effective address space is reduced to half (FIG. 3C).

In addition, as shown in FIG. 1, the parity generating circuit 9 generates parity data to ECC-correct the data output from the data latch circuit 7. The parity data is generated in units of 512 words (8192 bits) processed in one page write operation.

The ECC correcting circuit 11 corrects the read data output from the sense amplifier 3 based on the parity data and outputs the corrected data.

The multiplexer 12 receives the corrected data output from the ECC correcting circuit 11 and the flag data described later. The multiplexer 12 outputs the corrected data to the burst circuit 10. In addition, the multiplexer 12 outputs the flag data to the burst circuit 10 in response to input of a control signal that requires output of the flag data from the controlling circuit 4.

The burst circuit 10 successively outputs addresses of the data to be read according to the internal address signal in synchronization with an external clock signal "CLK" to the decoder 2. In addition, the burst circuit 10 outputs the data signal output from the multiplexer 12 to the input/output buffer 6 in synchronization with the external clock signal "CLK" (burst read operation).

As described above, the memory cells can be controlled to have a multivalued state or a pseudo binary state in units of an address space having a size of 512 words, which is a unit of parity generation, for example.

However, since the parity data is generated every 512 words as described above, for example, when a region of 512 words is in the multivalued state, multivalued data cannot be overwritten. Furthermore, when the region of 512 words is in the multivalued state, the region cannot be overwritten to be the pseudo binary state. Furthermore, when the region of 512 words is in the pseudo binary state, the region cannot be overwritten to be the multivalued state.

Furthermore, when the region of 512 words is in the pseudo binary state, no data can be written to the page 8 whose data is forcedly fixed to "1", for example. That is, the lower-order bit data masked to be "1" data have to be removed from the effective address space.

Because of these restrictions, information about whether each address space having a size of 512 words is controlled to be the multivalued state, the pseudo binary state or the initial erased state has to be stored. The control described above has to be performed according to the state.

Thus, in the embodiment 1, flag data to discriminate the state is provided for every 512 words, which is a unit of parity generation (a processing unit of the page write operation).

Figure 4:
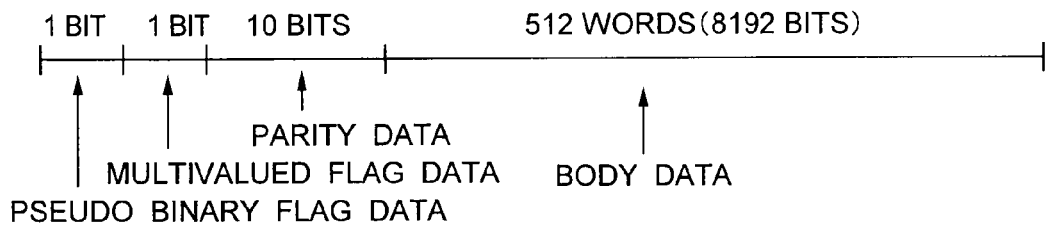
FIG. 4 is a diagram showing assignment of bits to the parity data and the flag data added to the body data.
Figure 5:
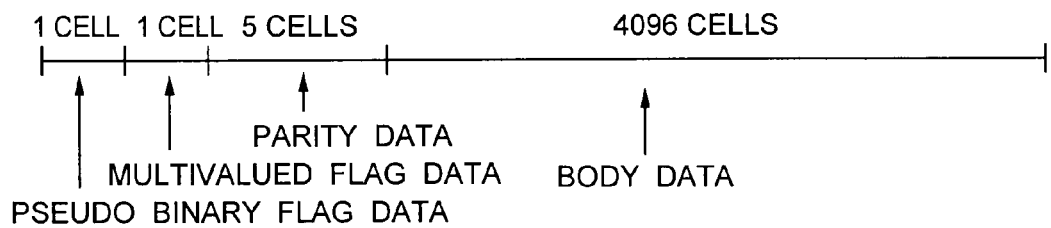
FIG. 5 is a diagram showing an example of assignment of memory cells to the parity data and the flag data added to the body data.
Figure 6:
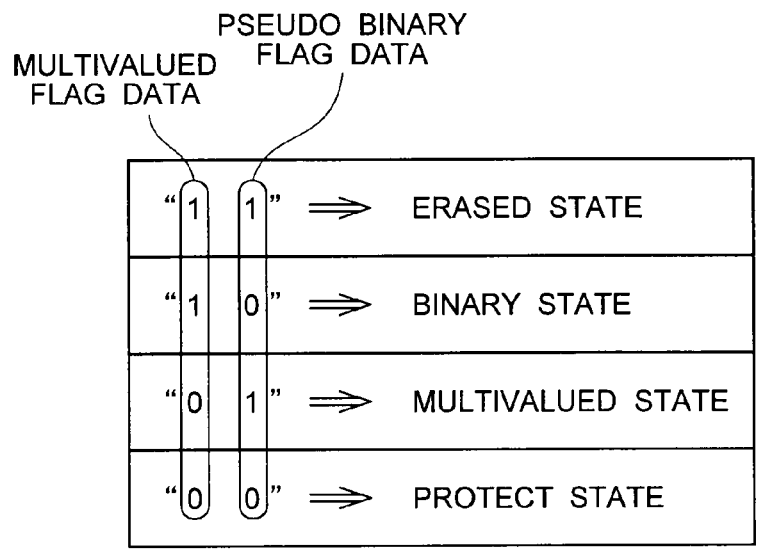
FIG. 6 is a diagram showing association between logics stored in a memory cell and states designated by the flag data.

FIG. 4 is a diagram showing assignment of bits to the parity data and the flag data added to the body data. FIG. 5 is a diagram showing an example of assignment of memory cells to the parity data and the flag data added to the body data. FIG. 6 is a diagram showing association between logics stored in a memory cell and states designated by the flag data.

As shown in FIG. 4, in the embodiment 1, for example, in addition to the parity data generated for every 512 words, pseudo binary flag data indicating a pseudo binary state (first flag data) and multivalued flag data indicating a multivalued state (second flag data) are provided. In the following, the simple expression "flag data" means both the flag data.

As shown in FIG. 5, for example, the multivalued flag data and the pseudo binary flag data are stored in two memory cells in the pseudo binary state that requires no ECC relief. That is, as shown in FIGS. 1 and 5, the body data, the added flag data and the added parity data are also a minimum unit of erasure, which is a unit of erasure, and are stored in a plurality of memory cells connected to one word line.

Furthermore, as shown in FIG. 6, the flag data stored in the memory cell indicates the erased state when the data is (11), the multivalued state when the data is (01), the pseudo binary state when the data is (10), and the write protect state when the data is (00), for example. When pseudo binary flag data is stored, the logic of the associated bit is rewritten from "1" to "0", for example. When multivalued flag data is stored, the logic of the associated bit is rewritten from "1" to "0", for example.

Figure 7:
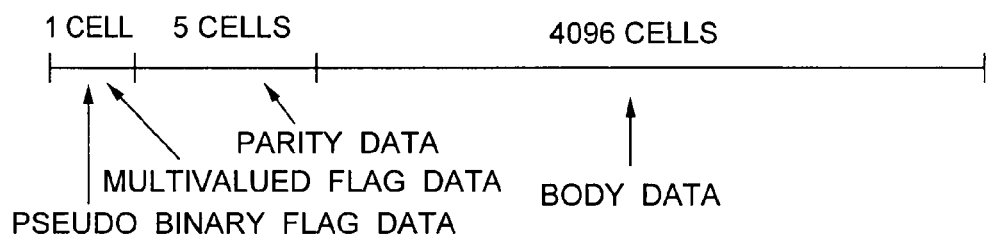
FIG. 7 is a diagram showing another example of assignment of memory cells to the parity data and the flag data added to the body data.
Figure 8:
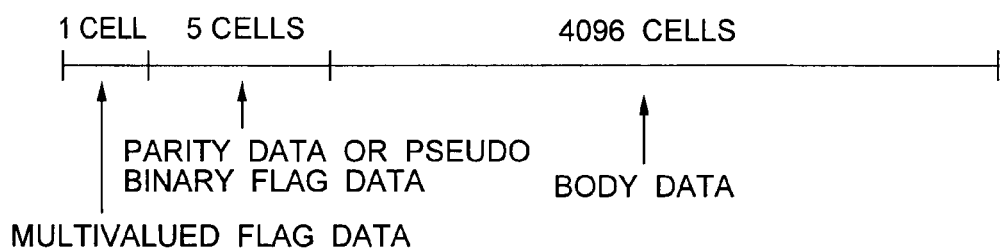
FIG. 8 is a diagram showing another example of assignment of memory cells to the parity data and the flag data added to the body data.

FIG. 7 is a diagram showing another example of assignment of memory cells to the parity data and the flag data added to the body data. FIG. 8 is a diagram showing another example of assignment of memory cells to the parity data and the flag data added to the body data.

As shown in FIG. 7, the multivalued flag data and the pseudo binary flag data may be stored in one memory cell in a multivalued state.

Furthermore, when the pseudo binary flag data is written, the data is not subjected to the ECC correction, and the parity data is not necessary. Therefore, when a 512-word-size address space is controlled to be the pseudo binary state, as shown in FIG. 8, the pseudo binary flag data may be stored in the memory cell intended to store the parity data. In this way, the number of memory cells can be reduced, so that the circuit area can also be reduced.

Next, the word write operation and the page write operation of the NOR flash memory 100 using the flag data (the pseudo binary flag data and the multivalued flag data) will be described.

Figure 9:
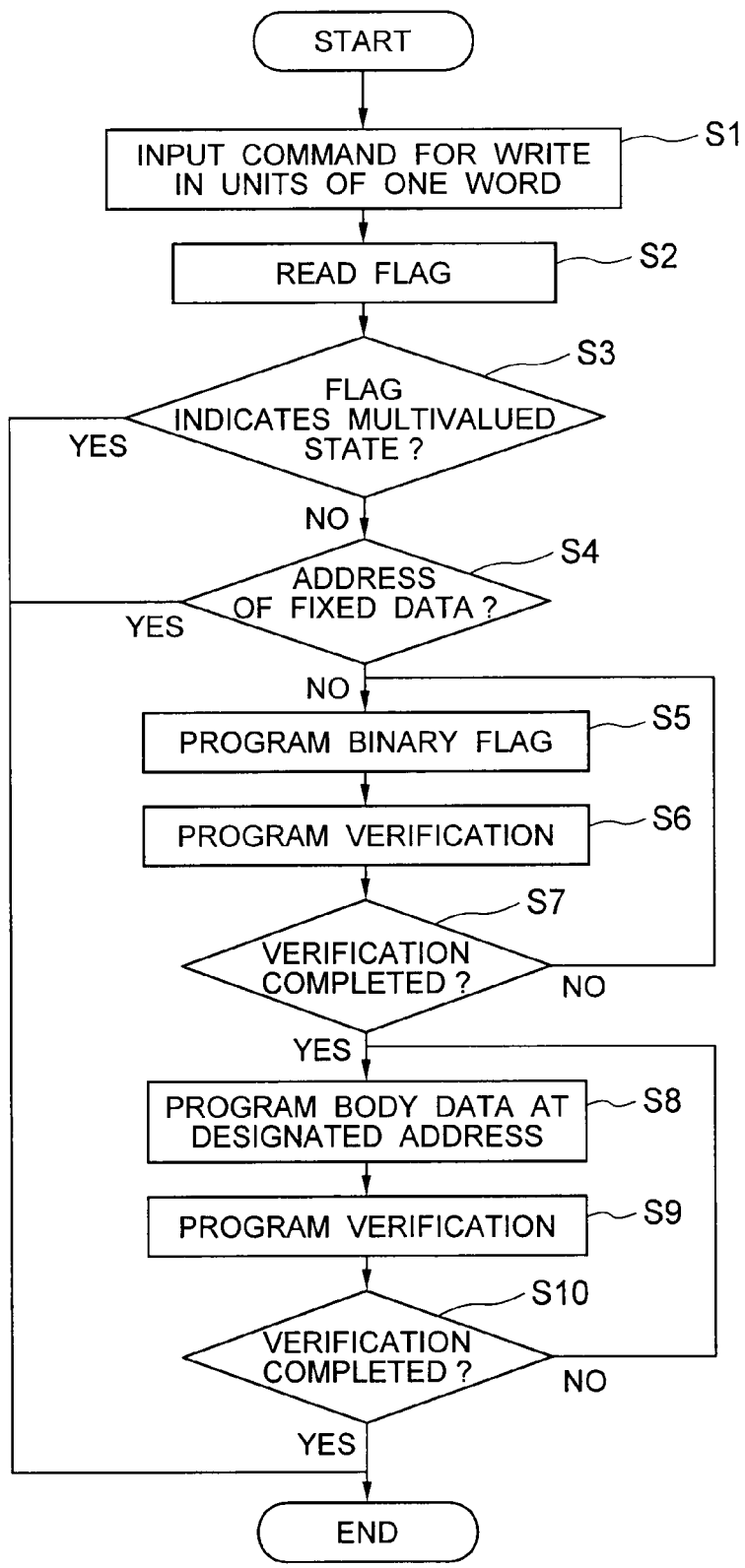
FIG. 9 is a flowchart showing an example of the word write operation of the NOR flash memory 100 according to the embodiment 1.

First, an exemplary flow of the word write operation will be described. FIG. 9 is a flowchart showing an example of the word write operation of the NOR flash memory 100 according to the embodiment 1.

First, the controlling circuit 4 recognizes writing in units of one word in response to an internal address signal and a data signal. Then, the controlling circuit 4 outputs a control signal for flag reading to the decoder 2 (step S1).

Then, in response to the control signal, the decoder 2 selects a bit line and a word line in the memory cell array 1 and drives the memory cell corresponding to the designated address. As a result, flag data that indicates the state of the 512-word-size address space including the designated address is read from the memory cell array 1 and input to the controlling circuit 4 via the sense amplifier 3 (step S2).

Then, the controlling circuit 4 determines whether the input flag data indicates a multivalued state or not (step S3).

For example, when the controlling circuit 4 determines that the flag data indicates a multivalued state in step S3, the body data is stored in the multivalued state, so that writing in units of one word cannot be performed as described above, and therefore, the write operation is ended.

On the other hand, when the controlling circuit 4 determines that the flag data does not indicate a multivalued state in step S3, the address space is in the erased state, or the body data is stored in the pseudo binary state, so that it is determined that writing in units of one word can be performed, and therefore, the process proceeds to step S4.

Then, the controlling circuit 4 determines whether or not the designated address is an address of a page whose data is fixed to "1" to bring the page into the pseudo binary state (step S4).

For example, when the controlling circuit 4 determines that the designated address is an address of a page whose data is fixed to "1", for example, the logic of the data to be stored is already determined, so that writing can not be performed, and therefore, the write operation is ended.

On the other hand, when the controlling circuit 4 determines that the designated address is not an address of a page whose data is fixed to "1", for example, the process proceeds to step S5.

When the designated address is not an address of a page whose data is fixed, writing in units of one word can be performed. Therefore, the controlling circuit 4 sets flag data that indicates a binary state, output the flag data to the data compressing circuit 8, and outputs a control signal to write the flag data to the decoder 2.

Then, the data compressing circuit 8 outputs compressed flag data. Then, the decoder 2 selects a bit line and a word line in the memory cell array 1 according to the control signal and the output of the data compressing circuit 8, drives the memory cell corresponding to the designated address, and writes the flag data (step S5).

Then, verification of the flag data is performed (step S6). Then, the controlling circuit 4 determines whether the verification is completed or not based on the output of the sense amplifier 3 (step S7).

If the verification is not completed, the process returns to step S5, and the verification is performed again.

On the other hand, if the verification is completed, the process proceeds to step S8.

Then, the controlling circuit 4 outputs a control signal to write the body data at the designated address to the decoder 2. Then, the data compressing circuit 8 outputs the compressed body data. Then, the decoder 2 selects a bit line and a word line in the memory cell array 1 according to the control signal and the output of the data compressing circuit 8, drives the addressed memory cell, and writes the body data (step S8).

Then, verification of the body data is performed (step S9).

Then, the controlling circuit 4 determines whether the verification is completed or not based on the output of the sense amplifier 3 (step S10).

If the verification is not completed, the process returns to step S8, and the verification is performed again.

On the other hand, if the verification is completed, the write operation is ended.

The word write operation of the NOR flash memory 100 is performed as described above.

As described above, in the flow shown in FIG. 9, after the command to perform writing in units of one word is input, and the flag data is read and it is determined whether the body data is in the multivalued state or the pseudo binary state during the initial operation.

If flag data indicating the pseudo binary state has already been written when the writing in units of one word is performed, writing of the flag indicating the pseudo binary state is omitted, and the body data is immediately written at the designated address. In this case, the write time of the writing in units of one word can be reduced.

In the following, another example of the flow of the write operation in units of one word will be described.

Figure 10:
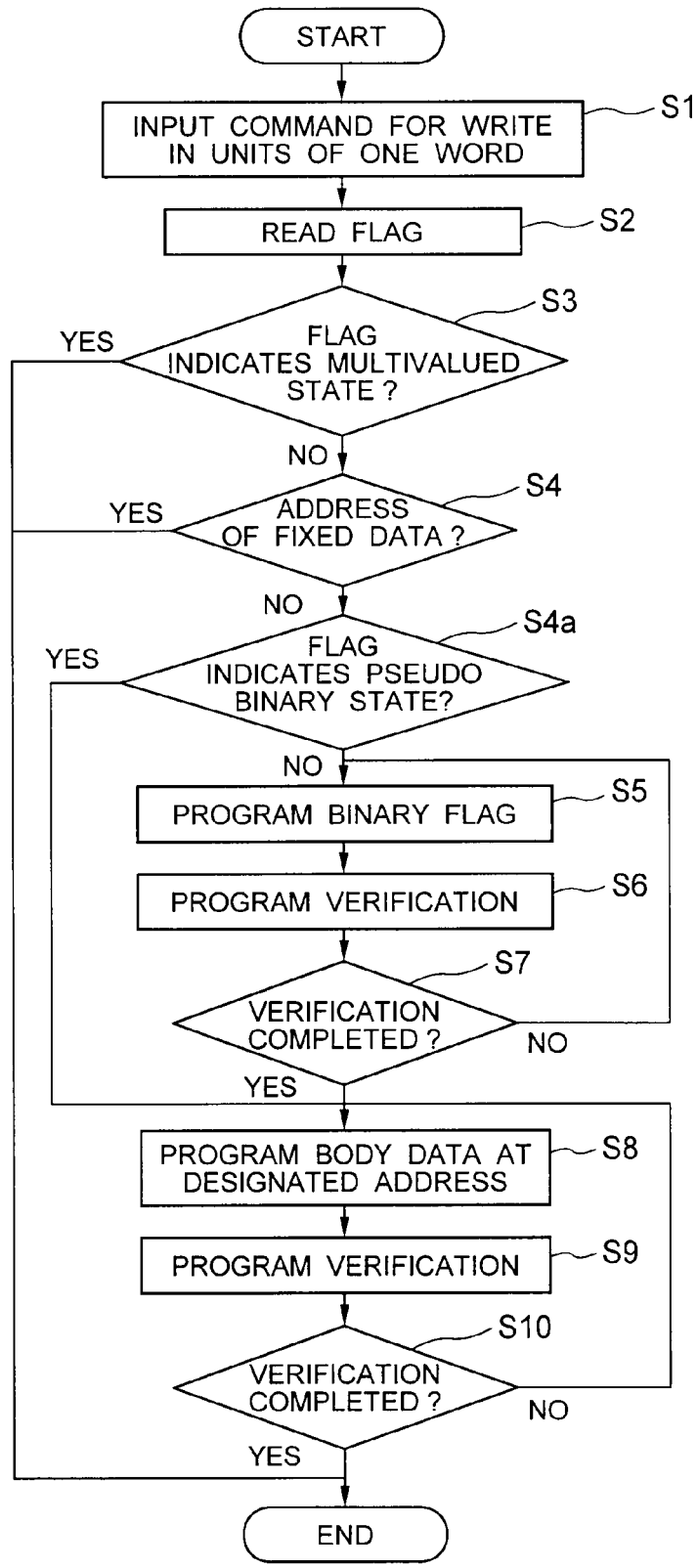
FIG. 10 is a flowchart showing another example of the write operation in units of one word of the NOR flash memory 100 according to the embodiment 1.

FIG. 10 is a flowchart showing another example of the write operation in units of one word of the NOR flash memory 100 according to the embodiment 1.

In FIG. 10, the operation from step S1 to step S4 is the same as the operation from step S1 to step S4 shown in FIG. 9. In addition, the operation of the NOR flash memory 100 from step S5 to step S10 is the same as the operation from step S5 to step S10 shown in FIG. 9.

When the controlling circuit 4 determines that the designated address is not an address of a page whose data is fixed to "1", the process proceeds to step S4a.

In step S4a, the controlling circuit 4 determines whether the input flag data indicates a pseudo binary state or not.

For example, when the controlling circuit 4 determines that the flag data indicates a pseudo binary state in step S4a, there is no need to newly write flag data indicating a pseudo binary state, and therefore, the process proceeds to step S8.

On the other hand, when the controlling circuit 4 determines that the flag data does not indicates a pseudo binary state in step S4a, flag data indicating a pseudo binary state has to be written, and therefore, the process proceeds to step S5.

The following flow is the same as the flow shown in FIG. 9.

The operation time of the write operation in units of one word can be reduced by the operation of the NOR flash memory 100 described above.

Next, an exemplary flow of the write operation in units of a plurality of words (512 words, for example) (the page write operation) will be described.

Figure 11:
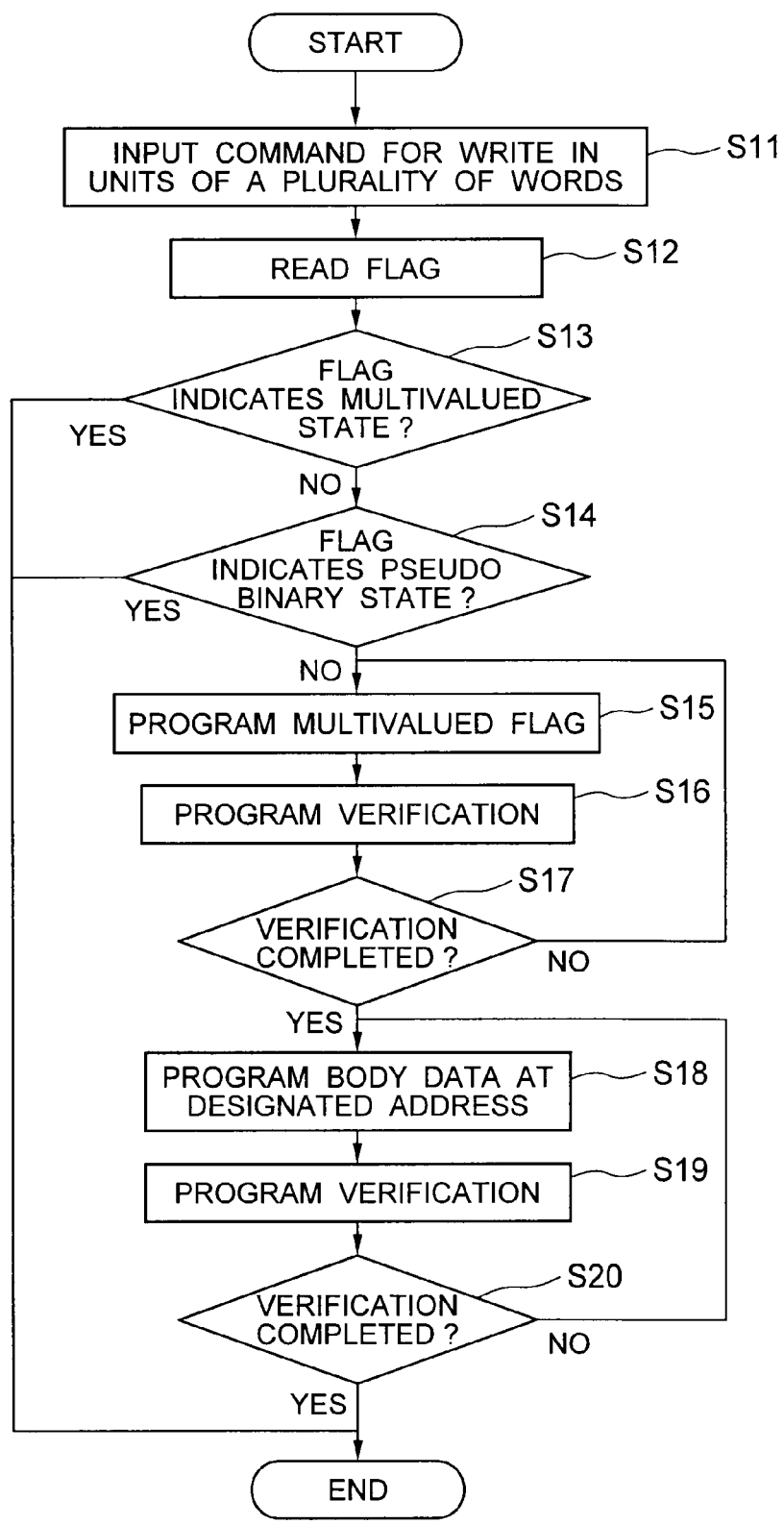
FIG. 11 is a flowchart showing an example of the page write operation of the NOR flash memory according to the embodiment 1.

FIG. 11 is a flowchart showing an example of the page write operation of the NOR flash memory according to the embodiment 1.

First, the controlling circuit 4 recognizes writing in units of one page in response to an internal address signal and a data signal. Then, the controlling circuit 4 outputs a control signal for flag reading to the decoder 2 (step S11).

Then, in response to the control signal, the decoder 2 selects a bit line and a word line in the memory cell array 1 and drives the memory cell at the designated address. As a result, flag data that indicates the state of the designated 512-word-size address space is read from the memory cell array 1 and input to the controlling circuit 4 via the sense amplifier 3 (step S12).

Then, the controlling circuit 4 determines whether the input flag data indicates a multivalued state or not (step S13).

For example, when the controlling circuit 4 determines that the flag data indicates a multivalued state in step S13, the body data is stored in the multivalued state, so that writing in units of a plurality of words cannot be performed as described above, and therefore, the write operation is ended.

On the other hand, when the controlling circuit 4 determines that the flag data does not indicate a multivalued state in step S13, it is determined that the address space is in the erased state, or the body data is stored in the pseudo binary state.

Then, the controlling circuit 4 determines whether the input flag data indicates a pseudo binary state or not (step S14).

For example, when the controlling circuit 4 determines that the flag data indicates a pseudo binary state in step S14, writing in units of a plurality of words cannot be performed, and therefore, the write operation is ended.

On the other hand, when the controlling circuit 4 determines that the flag data does not indicates a pseudo binary state in step S14, it is determined that the address space is in the erased state.

If the designated 512-word-size address space is in the erased state, writing in units of a plurality of words can be performed. Therefore, the controlling circuit 4 sets flag data indicating a multivalued state, outputs the flag data to the data compressing circuit 8 and outputs a control signal to write the flag data to the decoder 2.

Then, the data compressing circuit 8 outputs compressed flag data. Then, the decoder 2 selects a bit line and a word line in the memory cell array 1 according to the control signal and the output of the data compressing circuit 8, drives the addressed memory cell, and writes the flag data (step S15).

Then, verification of the flag data is performed (step S16).

Then, the controlling circuit 4 determines whether the verification is completed or not based on the output of the sense amplifier 3 (step S17).

If the verification is not completed, the process returns to step S15, and the verification is performed again.

On the other hand, if the verification is completed, the process proceeds to step S18.

Then, the controlling circuit 4 outputs a control signal to write the body data at the designated address to the decoder 2. Then, the data compressing circuit 8 outputs the compressed body data. Then, the decoder 2 selects a bit line and a word line in the memory cell array 1 according to the control signal and the output of the data compressing circuit 8, drives the addressed memory cell, and writes the body data (step S18). The parity data associated with the body data is also written in a predetermined memory cell.

Then, verification of the body data and the parity data is performed (step S19).

Then, the controlling circuit 4 determines whether the verification is completed or not based on the output of the sense amplifier 3 (step S20).

If the verification is not completed, the process returns to step S18, and the verification is performed again.

On the other hand, if the verification is completed, the write operation is ended.

The page write operation of the NOR flash memory 100 is performed as described above.

Next, a read operation (a burst read operation) of the NOR flash memory 100 will be described.

Referring to FIG. 1, when the burst circuit 10 receives an internal address signal for reading, the burst circuit 10 successively outputs addresses that specify the data to be read to the decoder 2 in synchronization with an external clock signal "CLK". The decoder 2 selects a bit line and a word line in the memory cell array 1 according to the output of the burst circuit 10 and drives the addressed memory cell. As a result, the read flag data is input to the burst circuit 10, and the read body data, flag data and parity data are input to the ECC correcting circuit 11.

Then, when a dedicated command (a flag output command) is input from the address buffer 5 and the input/output buffer 6, the controlling circuit 4 outputs the flag output command to the multiplexer 12. In response to the flag output command, the multiplexer 12 outputs the corrected data and the flag data to the burst circuit 10. Then, in synchronization with the external clock signal "CLK", the burst circuit 10 outputs the corrected data and the flag data input thereto to the input/output buffer 6 as the output data.

In this way, information about whether the designated 512-word-size address space is in the multivalued state or the pseudo binary state can be externally output. Therefore, an external system that controls the NOR flash memory can administer control of the 512-word-size address space, which is controlled to be the multivalued state, the pseudo binary state or the initial erased state.

Furthermore, as described above, when 512-word-size data is read, the multivalued flag data indicating the multivalued state and the pseudo binary flag data indicating the pseudo binary state that are provided every 512 words, for example, are read at the same time.

The ECC correcting circuit 11 performs an ECC relief when the multivalued flag data is input thereto. On the other hand, the ECC correcting circuit 11 does not perform the ECC relief when no multivalued flag data is input thereto.

Figure 12:
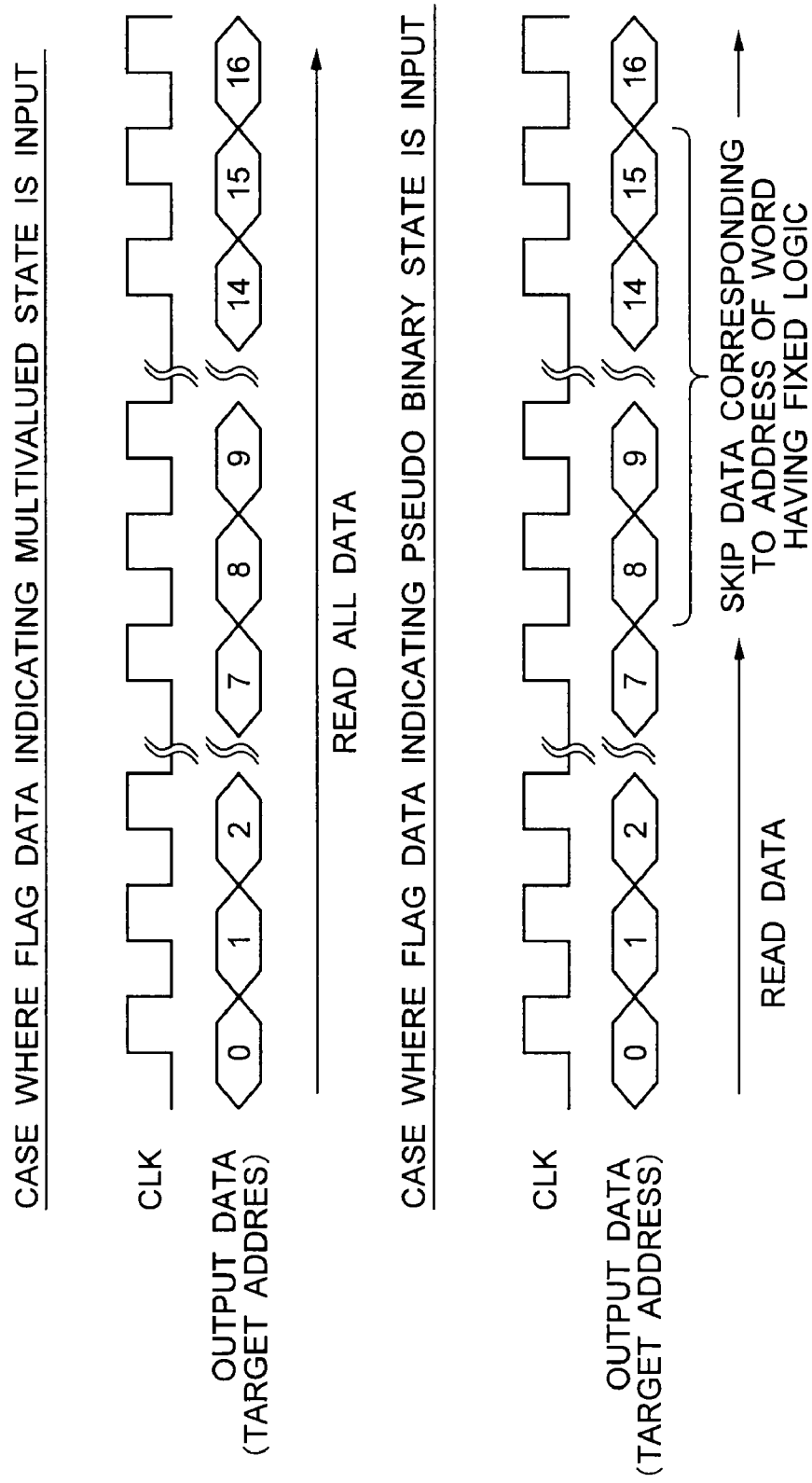
FIG. 12 is a diagram showing an example of the burst read operation of the NOR flash memory 100 according to the embodiment 1.

FIG. 12 is a diagram showing an example of the burst read operation of the NOR flash memory 100 according to the embodiment 1.

As shown in FIG. 12, when multivalued flag data indicating the multivalued state is input, the burst circuit 10 outputs all the read data in synchronization with the external clock "CLK".

When pseudo binary flag data indicating the pseudo binary state is input, for data corresponding to the address of the page whose logic is forcedly fixed in order to form the pseudo binary data, the burst circuit 10 may output the fixed logic ("1", for example) regardless of the read body data. In this case, even if the logic of the data held in the memory cells in the page whose logic is fixed to "1" erroneously changes from "1" to "0", the error does not externally appear.

Furthermore, when a flag indicating the pseudo binary state is input, the data corresponding to the address of the page whose logic is forcedly fixed is invalid, so that the burst circuit 10 skips the data corresponding to the address space as shown in FIG. 12. Thus, the burst circuit 10 outputs only the remaining valid data corresponding to the valid address space.

That is, in the case where pseudo binary flag data is stored, the data of one of the pages whose logic is fixed is not read, and only the stored data of the other page is read. Thus, the effective data read speed can be improved.

As described above, the NOR flash memory 100 according to this embodiment can stores pseudo binary data or multivalued data in the memory cells according to the unit of writing.

Embodiment 2

As described above, a nonvolatile semiconductor storage device according to an embodiment of the present invention is a NOR flash memory, for example, and has a multivalued data (MLC) writing function. In the case of writing of multivalued data, it is common practice to use an ECC circuit that generates parity data for error correction to improve the reliability.

Depending on the specified reliability and the chip size, the ECC circuit typically corrects one bit per a plurality of words. If one bit is corrected per word, the chip size is unrealistically large, although high reliability is ensured. Therefore, batch writing of the NOR flash memory has to be performed at least in units of a word region that can be corrected by the ECC circuit (referred to as ECC unit or ECC segment hereinafter). Practically, in order to improve the average write speed, batch writing of the NOR flash memory is generally performed in units of a plurality of segments, which is an ECC unit. This is referred to as page program.

On the other hand, a user of the memory may handle data in units of one word. Therefore, in order to efficiently use the storage region of the memory, a function of writing data in units of one word is needed. Thus, a NOR flash memory according to an embodiment 2 has a binary data (single level cell: SLC) writing function in addition to the MLC writing function. When the SLC is used, the ECC circuit is not used, and writing in units of one word can be performed. In the following, a case where the multivalued data writing function is used will be referred to as MLC mode, and a case where the binary data writing function is used will be referred to as SLC mode.

The MLC mode and the SLC mode can be switched in units of one address group (in general, in the unit of the page program). The user issues a command (instruction) to determine which address group in the memory is set in the SLC mode. Therefore, in the memory, a redundant part (flag storage part, parity storage part) 1a is provided for each address group, and flag data indicating the MLC mode or the SLC mode is stored in the redundant part 1a.

If the SLC mode is selected, the address region actually used for data writing is halved. In this case, equal numbers of valid addresses and invalid addresses appear for every ECC unit.

Figure 13A:
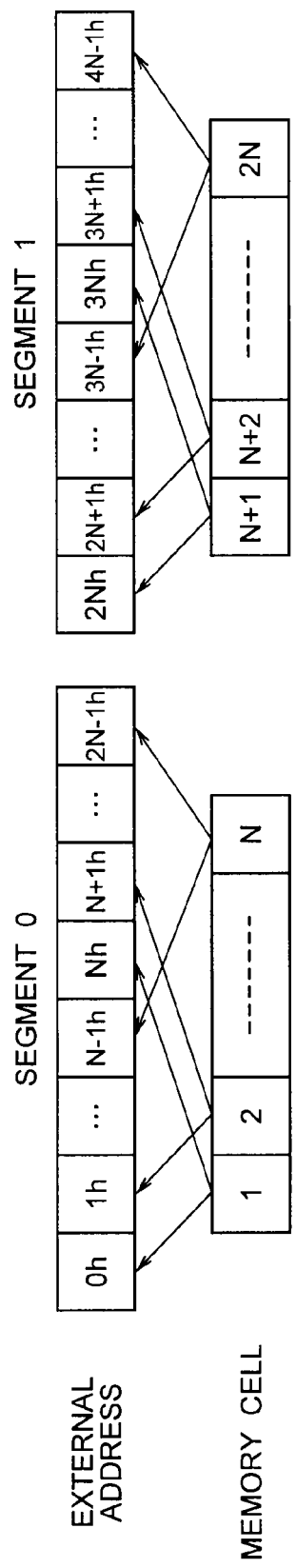
FIG. 13A is a diagram showing a relationship between external addresses and memory cells in the case where the MLC mode is selected.

FIG. 13A is a diagram showing a relationship between external addresses and memory cells in the case where the MLC mode is selected. As shown in this drawing, in the case where multivalued data is stored, data at a plurality of addresses are stored in the same memory cell. FIG. 13A shows an example in which the ECC unit is "2N" words.

FIG. 13A assumes that one word (16 bits) of data is written at one address. Therefore, practically, data is written to 16 memory cells for each address. However, for the sake of simplicity, FIG. 13A shows only one of the 16 memory cells.

Figure 13B:
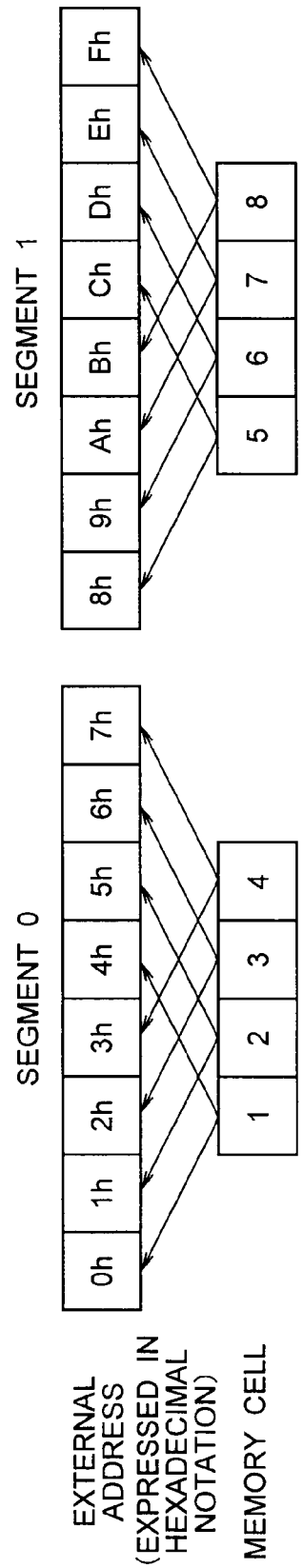
FIG. 13B shows an example in which "N" shown in FIG. 13A is 4 (N=4)

FIG. 13B shows an example in which "N" shown in FIG. 13A is 4 (N=4). The same holds true for this case, and data for two addresses are stored in each memory cell. Therefore, for each ECC unit, eight addresses are associated with four words of memory cells.

FIG. 14A is a diagram showing a relationship between external addresses and memory cells in the case where the SLC mode is selected. FIG. 14A shows an example in which only the addresses in the first half of each ECC unit are associated with memory cells as valid addresses. The addresses in the second half of each ECC unit are invalid addresses and are not used for storage in memory cells.

FIG. 14B shows an example in which "N" shown in FIG. 14A is 4 (N=4). The same holds true for this case, and only the addresses in the first half of each ECC unit are used for storage in memory cells.

As shown in FIGS. 14A and 14B, in the case where the SLC mode is selected, only a half of the external addresses are used for storage in memory cells, and the external addresses used for storage in memory cells are discrete. Therefore, successive addresses cannot be externally specified in data writing, and discrete addresses have to be specified, so that there is a problem that the burden on the user (programmer) is heavy.

FIGS. 13 and 14 show examples of the page program in which data is written to memory cells in units of one ECC unit, which is the unit of the page program. However, in general, the data erase unit of the flash memory is greater than the data write unit. The unit of data erasure is referred to as erase block.

Figure 15:
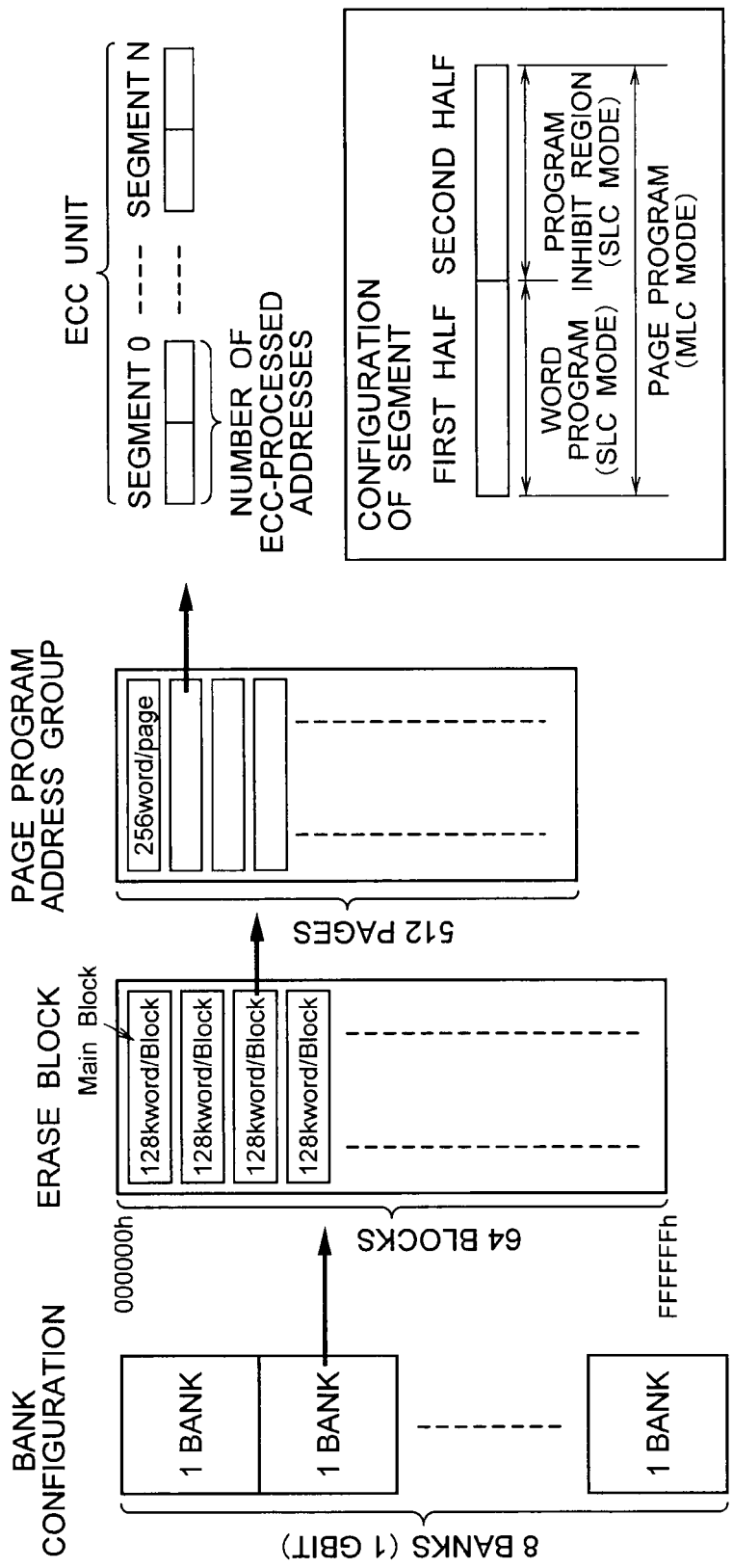
FIG. 15 is a schematic diagram showing an example of the page program unit and the erase block unit.

FIG. 15 is a schematic diagram showing an example of the page program unit and the erase block unit. In FIG. 15, the ECC unit is composed of 32 segments, and each segment is composed of eight words. Therefore, the ECC unit is composed of 8×32=256 words, which correspond to one page.

The pages program address group has a region of 512 pages=256 words×512=128 Kwords. This region is the unit of data erasure and constitutes the erase block. A region of 64 erase blocks, that is, a region of 64×128 Kwords/block=8 Mwords, corresponds to one bank. The NOR flash memory has a plurality of banks of data capacity. For example, the NOR flash memory shown in FIG. 15 has eight banks, and the total data capacity of the memory is 8×8 Mwords/bank=64 Mwords=1 Gbit.

The data capacities of the pages program, the erase block and the bank are shown only for the illustrative purposes, and various modifications are possible.

For a NOR flash memory according to the embodiment 2 described below, data is written in units of one ECC unit, which is composed of 256 words, and data is erased in units of one erase block, which is composed of 128 Kwords.

Figure 16:
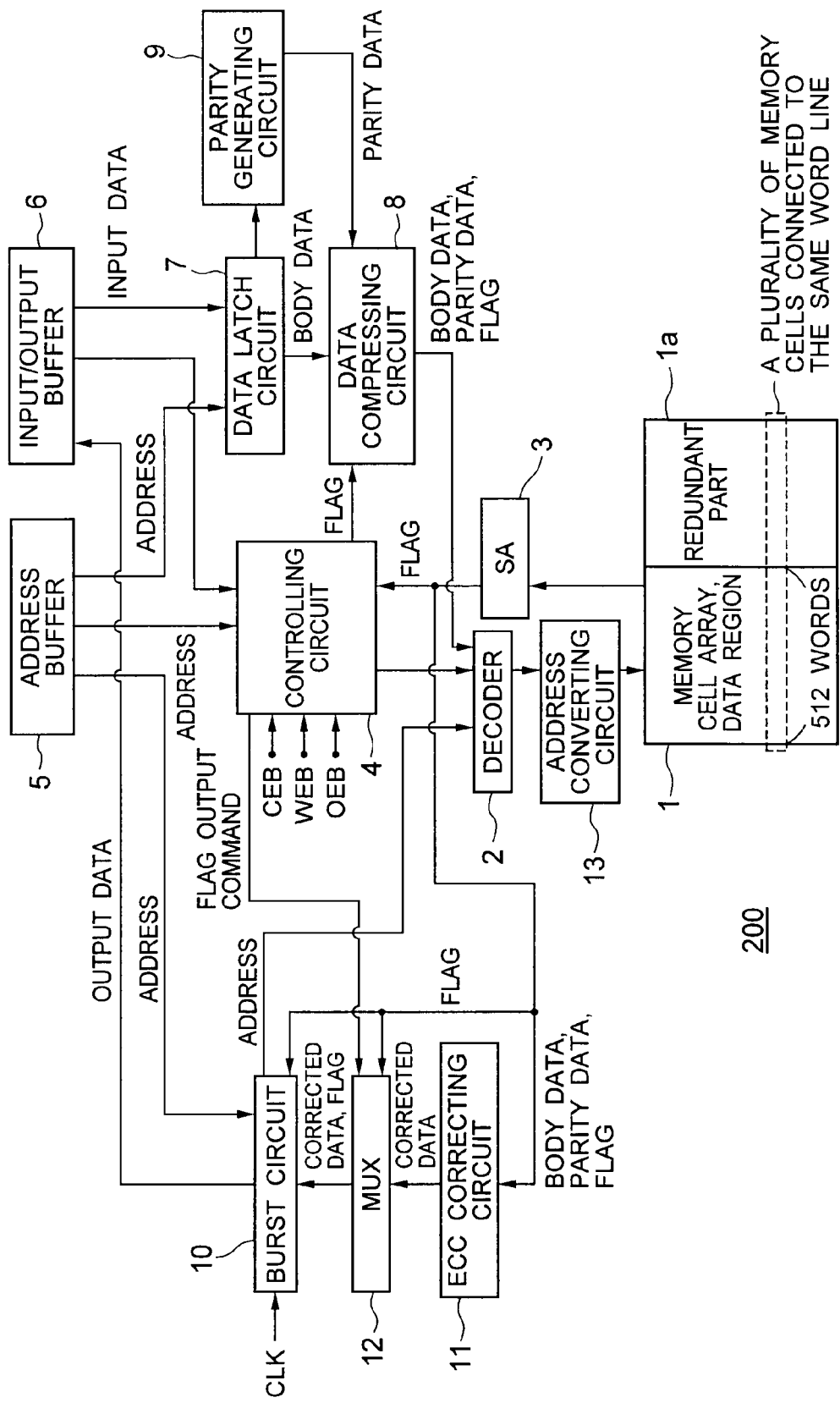
FIG. 16 is a block diagram showing an exemplary internal configuration of a NOR flash memory 200.

FIG. 16 is a block diagram showing an exemplary internal configuration of a NOR flash memory 200.

The NOR flash memory 200 shown in FIG. 16 has a memory cell array 1, a decoder 2, a sense amplifier 3, a controlling circuit 4, an address buffer 5, an input/output buffer 6, a data latch circuit 7, a data compressing circuit 8, a parity generating circuit 9, a burst circuit 10, an ECC correcting circuit 11, a multiplexer 12, and an address converting circuit 13. The controlling circuit 4 and the address converting circuit 13 constitute an access range setting part.

The configuration of the NOR flash memory 200 according to the embodiment 2 excluding the address converting circuit 13 is the same as the configuration of the NOR flash memory 100 shown in FIG. 1.

In the embodiment 2, the MLC mode and the SLC mode can be switched in units of 256 words, which is the unit of the page program, and parity data and flag data are generated for every 256 words. The flag data include flag data indicating the MLS mode and flag data indicating the SLC mode, which are stored in separate memory cells. More specifically, the flag data is defined as (11) in an erased state, as (01) in a multi-valued state, as (10) in a binary state and as (00) in a write protect state, for example, and stored in two memory cells. When the SLC mode is selected, ECC correction of data is not performed, and no parity data is required.

The NOR flash memory 200 shown in FIG. 16 is characterized in that successive addresses can be externally supplied to access memory cells in units of one word in the SLC mode. To achieve this, the NOR flash memory 200 in FIG. 16 has the address converting circuit 13. The address converting circuit 13 generates an internal address by rearranging a part of the bit sequence of the external address. When an external address is supplied, a memory cell corresponding to the internal address converted from the external address by the address converting circuit 13 is selected.

Figures 17A, 17B:
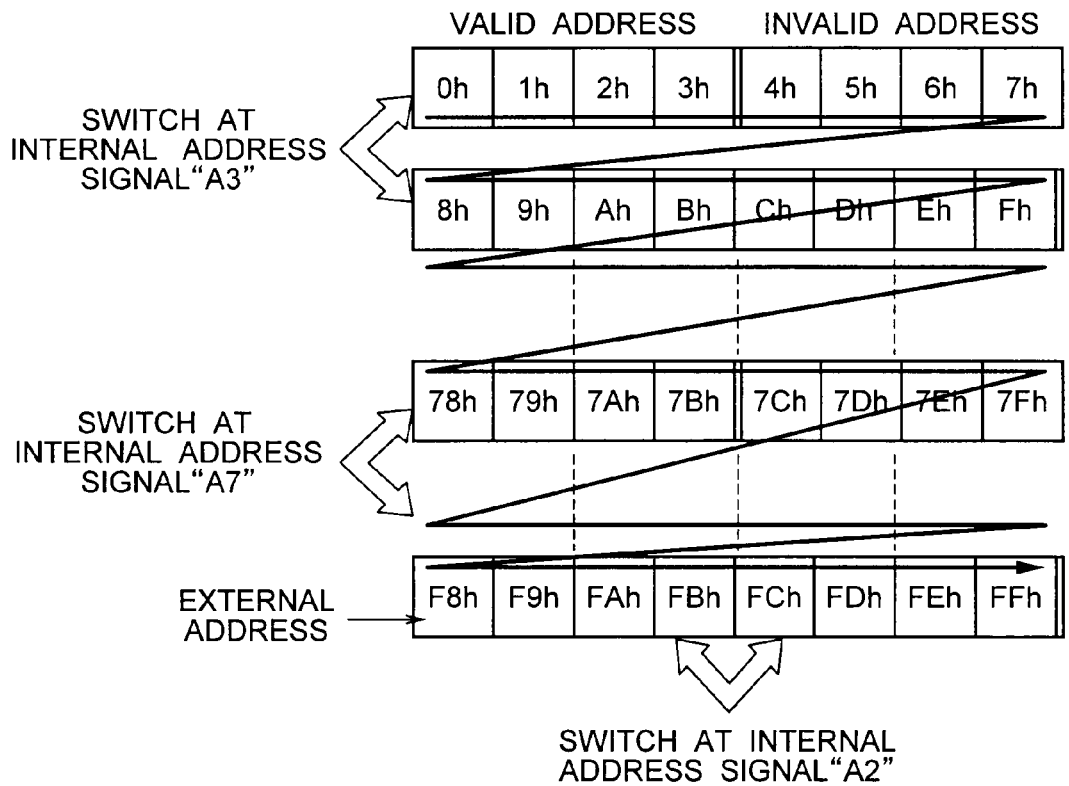
FIG. 17A is a diagram showing a relationship between external addresses and internal cells in the case where address conversion is not performed.
FIG. 17B is a diagram showing a relationship between external addresses and internal addresses in the case shown in FIG. 17A.

FIGS. 17 and 18 are diagrams for illustrating an operation of the address converting circuit 13. FIG. 17A is a diagram showing a relationship between external addresses and internal cells in the case where address conversion is not performed, and FIG. 17B is a diagram showing a relationship between external addresses and internal addresses in the case shown in FIG. 17A. In the case where address conversion is not performed, the internal addresses are the same as the external addresses. However, when the external addresses are successively incremented, valid addresses for which memory cells can be accessed and invalid addresses for which memory cells cannot be accessed alternately appear. More specifically, memory cells can be accessed for external addresses "0h" to "3h", whereas memory cells cannot be accessed for the subsequent external addresses "4h" to "7h". Thus, successive accesses can be permitted only up to four word addresses.

Figures 18A, 18B:
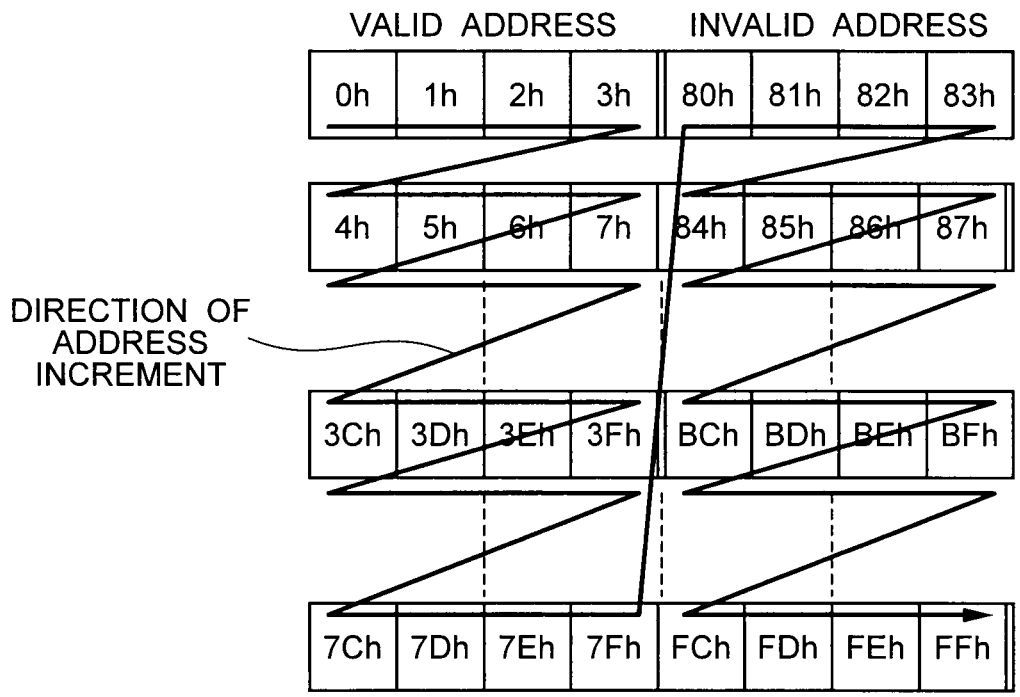
FIG. 18A is a diagram showing a relationship between external addresses and internal cells in the case where the address converting circuit 13 is provided.
FIG. 18B is a diagram showing a relationship between external addresses and internal addresses in the case shown in FIG. 18A.

On the other hand, FIG. 18A is a diagram showing a relationship between external addresses and internal cells in the case where the address converting circuit 13 is provided, and FIG. 18B is a diagram showing a relationship between external addresses and internal addresses in the case shown in FIG. 18A. As shown in FIG. 18B, external addresses "A2" to "A6" are shifted by one bit, the shifted external addresses "A2" to "A6" are assigned to internal addresses "A3" to "A7", respectively, and an external address "A7" (generally, 0) is assigned to an internal address "A2". As a result, as shown in FIG. 18A, for the external addresses "0h" to "7Fh", memory cells can be successively accessed. The subsequent addresses "80h" to "FFh" are all invalid addresses for which memory cells cannot be accessed.

In this way, by providing the address converting circuit 13, the range of memory cells that can be successively accessed using external addresses can be substantially increased, external addressing in the SLC mode is facilitated, and the NOR flash memory can be more efficiently used.

Figure 19:
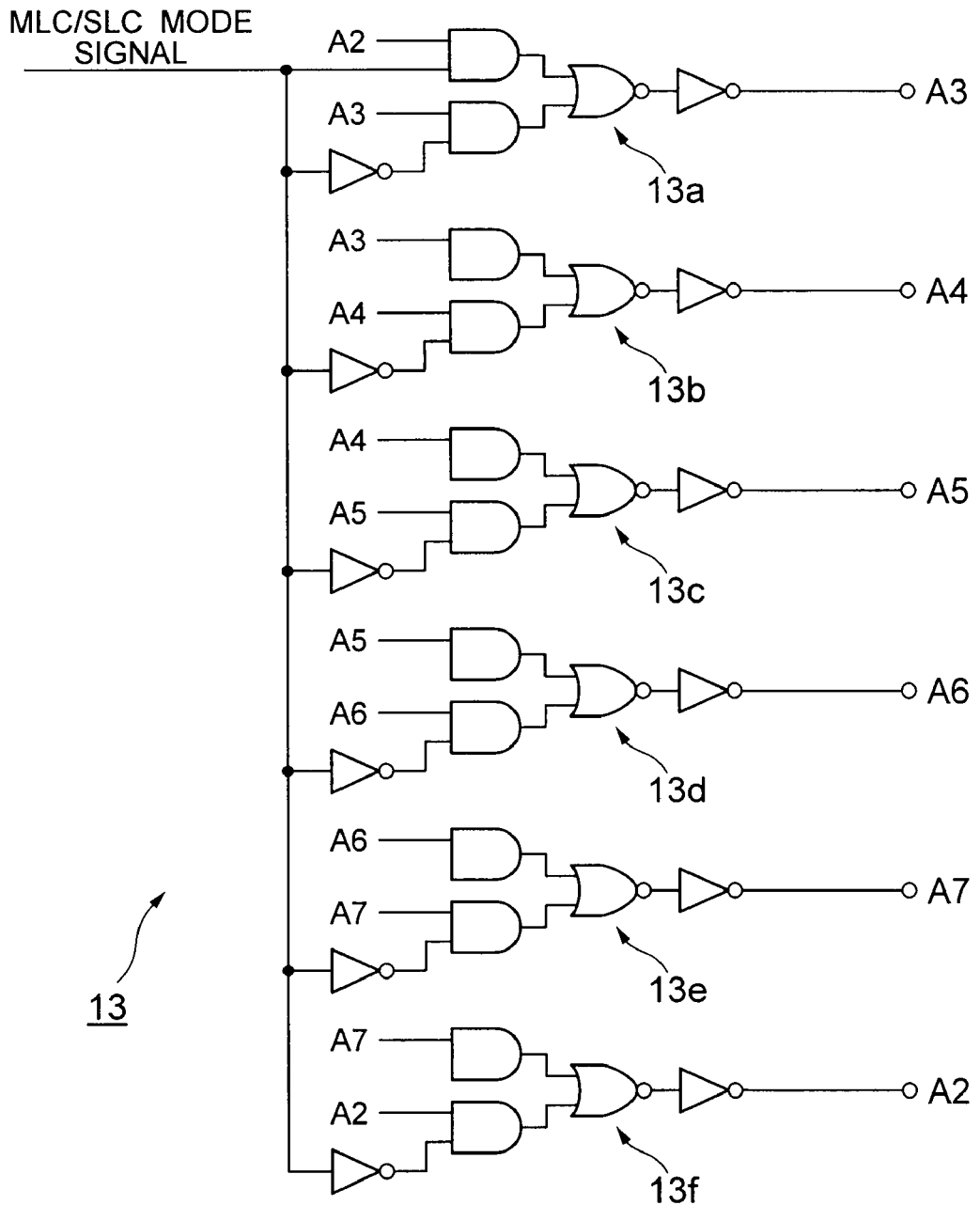
FIG. 19 is a circuit diagram showing an exemplary internal configuration of the address converting circuit 13.

FIG. 19 is a circuit diagram showing an exemplary internal configuration of the address converting circuit 13. As shown in this drawing, the address converting circuit 13 has first to sixth address selecting circuits 13a to 13f that select one of two address bits of external addresses. The first to sixth address selecting circuits 13a to 13f perform address selection based on flag data (MLC/SLC mode signal).

The first address selecting circuit 13a selects one of the external addresses "A2" and "A3" and supplies the internal address "A3". The second address selecting circuit 13b selects one of the external addresses "A3" and "A4" and supplies the internal address "A4". The third address selecting circuit 13c selects one of the external addresses "A4" and "A5" and supplies the internal address "A5". The fourth address selecting circuit 13d selects one of the external addresses "A5" and "A6" and supplies the internal address "A6". The fifth address selecting circuit 13e selects one of the external addresses "A6" and "A7" and supplies the internal address "A7". The sixth address selecting circuit 13f selects one of the external addresses "A7" and "A2" and supplies the internal address "A2".

The first to sixth address selecting circuits shown in FIG. 19 are composed of a combination of an AND gate, a NOR gate and an inverter. However, the circuit configuration is not limited to that shown in this drawing.

In this way, in the embodiment 2, since the address converting circuit 13 that rearranges a part of the address bits of the external address in the SLC mode is provided, successive external addresses can be supplied to write and read data in units of one word in the SLC mode, and thus, the NOR flash memory 200 can be efficiently used in the SLC more.

Embodiment 3

In the embodiment 2, an example in which data can be written for successive addresses in page program units in the SLC mode has been described. However, according to an embodiment 3 described below, data can be written for successive addresses in units of one erase block. In the following, differences from the embodiment 2 will be particularly described.

The operation according to the embodiment 3 is essentially the same as that according to the embodiment 2 except for the address range for which data can be written by externally supplying successive addresses in the SLC mode.

Figure 20A:
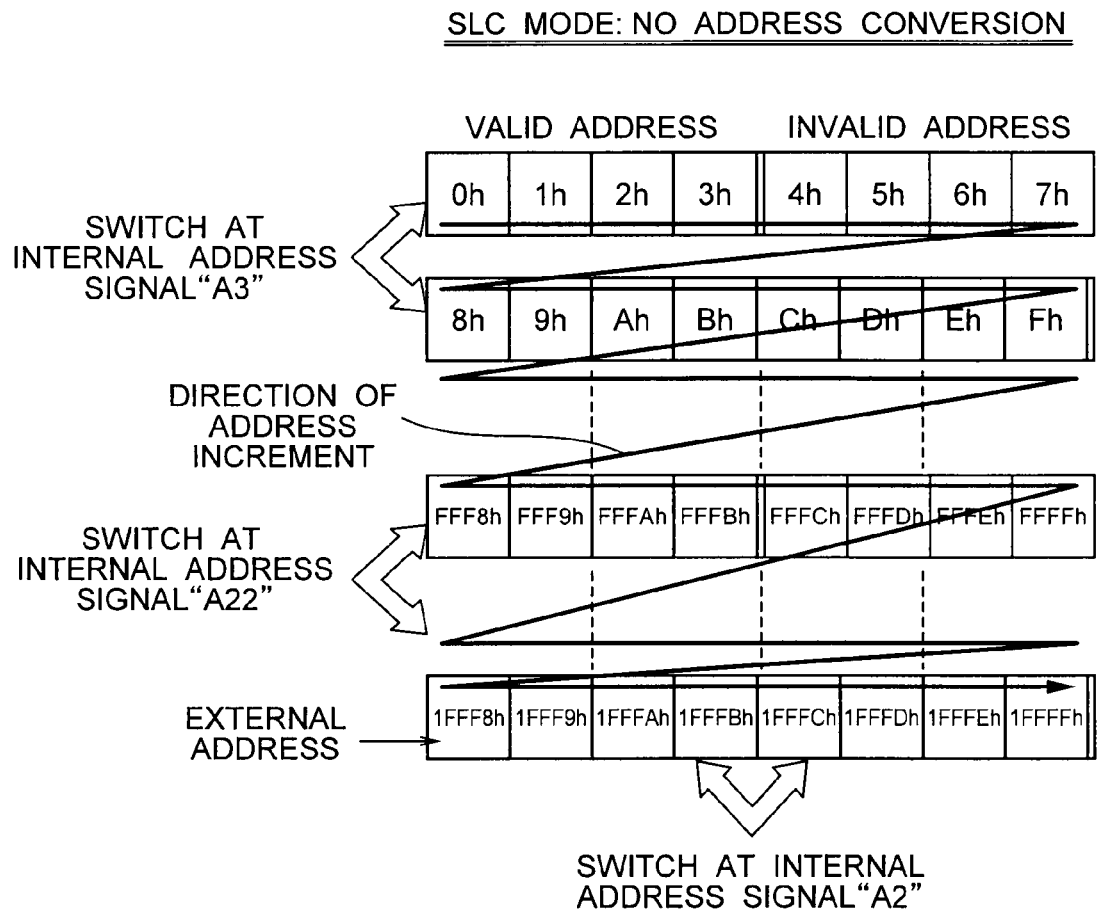
FIG. 20A is a diagram showing a relationship between external addresses and internal cells in the case where address conversion is not performed.
Figure 20B:
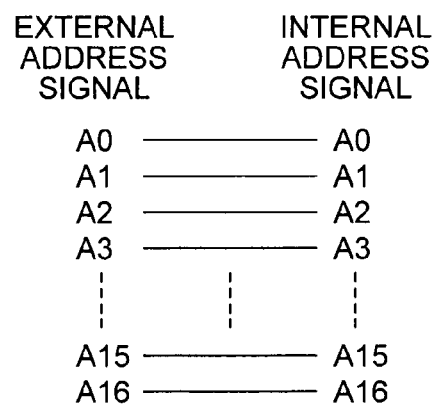
FIG. 20B is a diagram showing a relationship between external addresses and internal addresses in the case shown in FIG. 20A.

FIGS. 20 and 21 are diagrams for illustrating an operation of the address converting circuit 13 according to the embodiment 3. FIG. 20A is a diagram showing a relationship between external addresses and internal cells in the case where address conversion is not performed, and FIG. 20B is a diagram showing a relationship between external addresses and internal addresses in the case shown in FIG. 20A. In the case where address conversion is not performed, valid addresses for which memory cells can be accessed and invalid addresses for which memory cells cannot be accessed alternately appear.

Figure 21A:
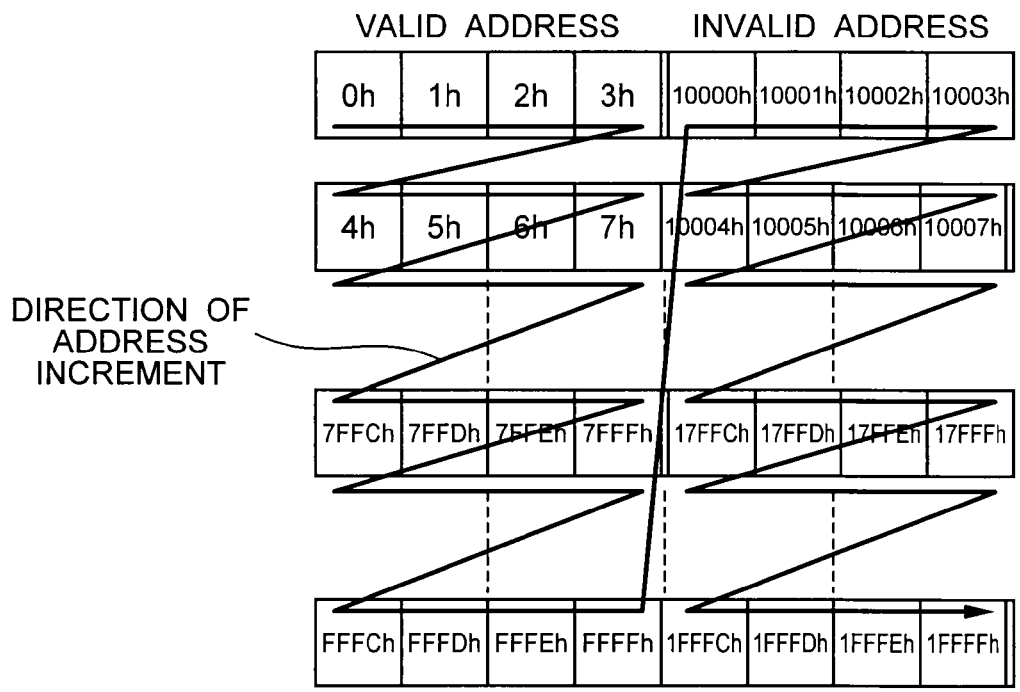
FIG. 21A is a diagram showing a relationship between external addresses and internal cells in the case where the address converting circuit 13 is provided.
Figure 21B:
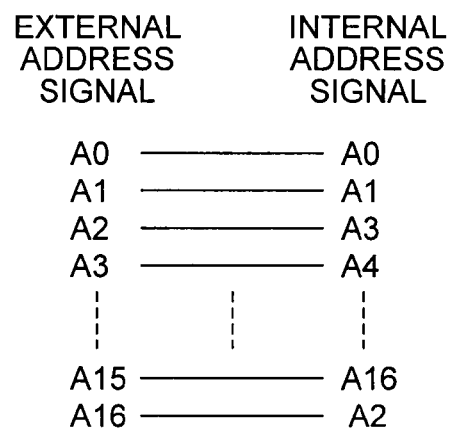
FIG. 21B is a diagram showing a relationship between external addresses and internal addresses in the case shown in FIG. 21A.

On the other hand, FIG. 21A is a diagram showing a relationship between external addresses and internal cells in the case where the address converting circuit 13 is provided, and FIG. 21B is a diagram showing a relationship between external addresses and internal addresses in the case shown in FIG. 21A.

As shown in FIG. 21B, external addresses "A2" to "A15" are shifted by one bit, the shifted external addresses "A2" to "A15" are assigned to internal addresses "A3" to "A16", respectively, and an external address "A16" (generally, 0) is assigned to an internal address "A2".

As a result, as shown in FIG. 21A, for the external addresses "0h" to "FFFFh", memory cells can be successively accessed. The subsequent addresses "10000h" to "1FFFFh" are all invalid addresses for which memory cells cannot be accessed.

In this way, in the embodiment 3, since data can be externally written for successive addresses in erase block units, data can be written for successive addresses in a larger address space than the embodiment 2, and thus, the NOR flash memory 200 can be more efficiently used than the embodiment 2.

Embodiment 4

There is no reason to limit the address range for which data is written for successive addresses in the SLC mode to the page program unit or erase block unit. Thus, according to an embodiment 4 described below, data can be written for successive addresses in any address range.

Figure 22A:
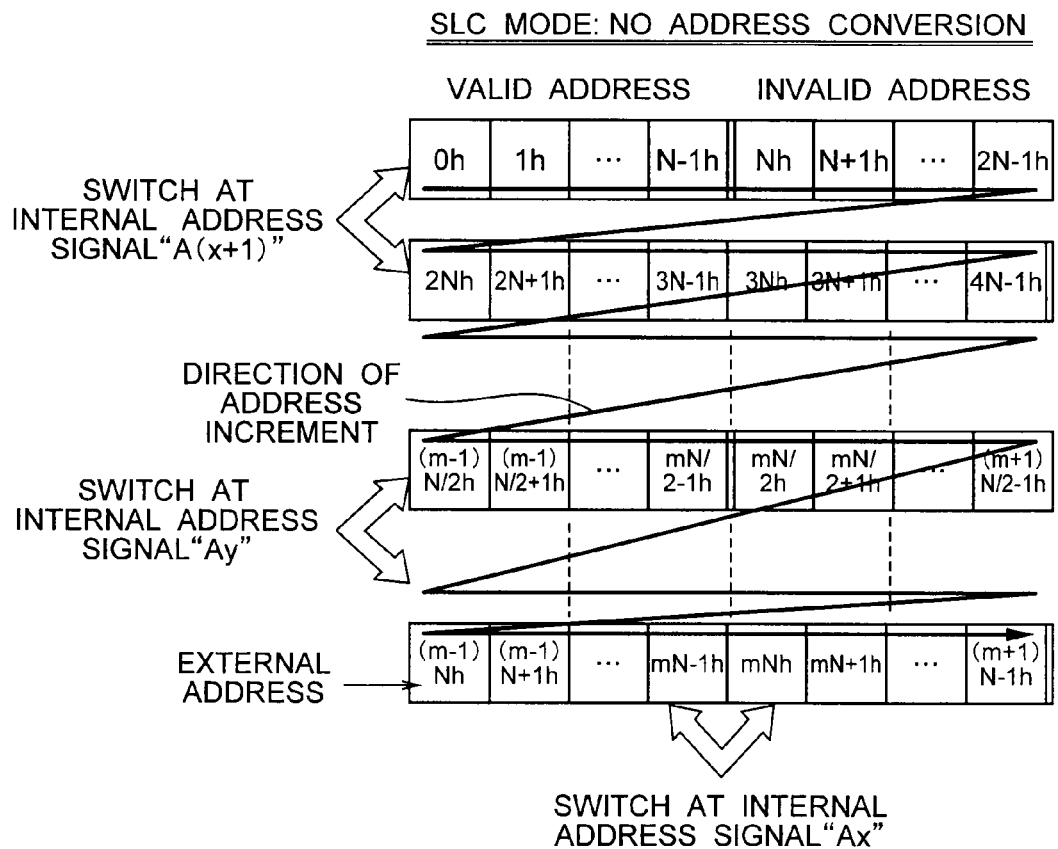
FIG. 22A is a diagram showing a relationship between external addresses and internal cells in the case where address conversion is not performed.
Figure 22B:
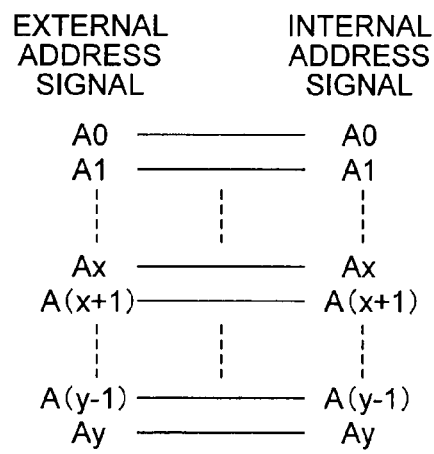
FIG. 22B is a diagram showing a relationship between external addresses and internal addresses in the case shown in FIG. 22A.
Figure 23A:
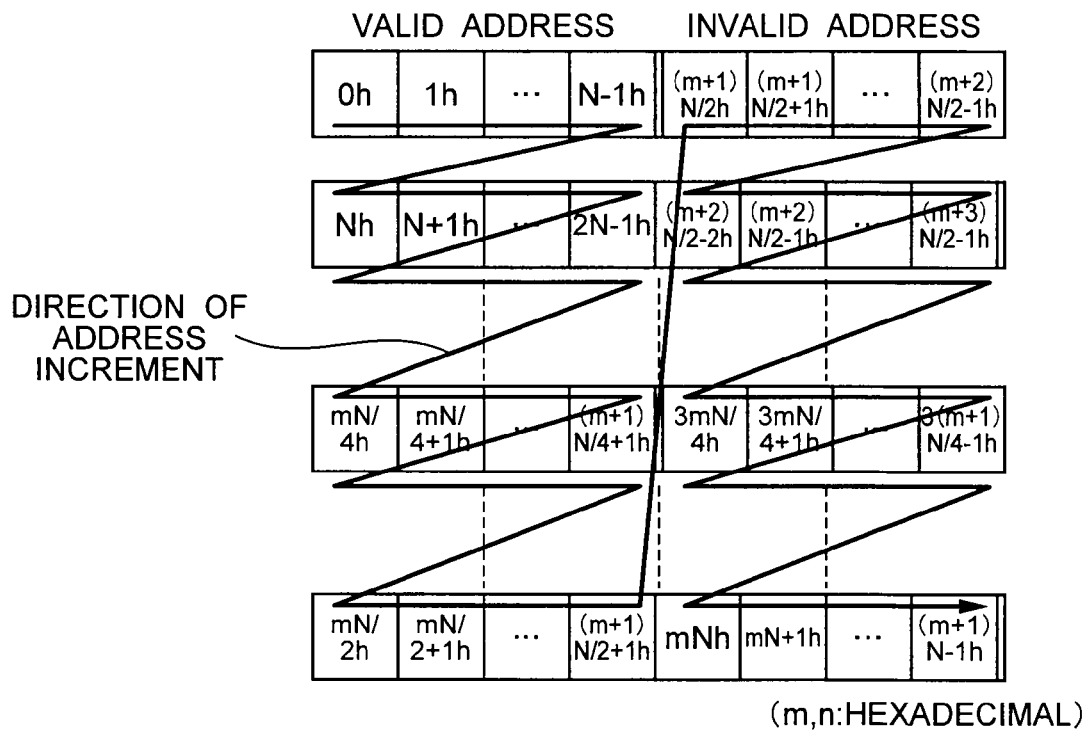
FIG. 23A is a diagram showing a relationship between external addresses and internal cells in the case where address conversion is performed.
Figure 23B:
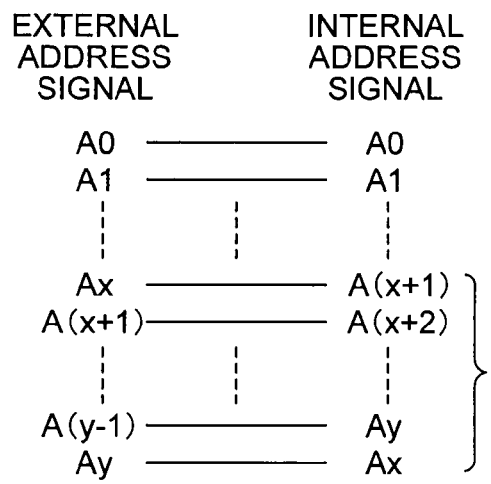
FIG. 23B is a diagram showing a relationship between external addresses and internal addresses in the case shown in FIG. 23A.

FIGS. 22 and 23 are diagrams for illustrating an operation of the address converting circuit 13 according to the embodiment 4. FIG. 22A is a diagram showing a relationship between external addresses and internal cells in the case where address conversion is not performed, and FIG. 22B is a diagram showing a relationship between external addresses and internal addresses in the case shown in FIG. 22A. FIG. 23A is a diagram showing a relationship between external addresses and internal cells in the case where address conversion is performed, and FIG. 23B is a diagram showing a relationship between external addresses and internal addresses in the case shown in FIG. 23A.

These drawings show examples in which data can be written for successive addresses in units of an address range of $2^{y+1}$ words in the SLC mode.

In the case where address conversion is performed, as shown in FIG. 23B, external addresses "A0" to "A(x−1)" are associated with internal addresses "A0" to "A(x−1)", respectively, external addresses "Ax" to "A(y−1)" are shifted by one bit and associated with internal addresses "A(x+1)" to "Ay", respectively, and an external address "Ay" is associated with an internal address "Ax".

As a result, in the SLC mode, data can be externally written for successive addresses in an address range of "0h" to "(m+1)N/2h" (m, N are hexadecimal digits).

In this way, in the embodiment 4, data can be externally written for successive addresses in any address range in the memory cell array in the SLC mode.

Embodiment 5

The application of the NOR flash memories 100 and 200 according to the embodiments 1 to 4 described above is not particularly limited, and the NOR flash memories 100 and 200 can be used as a storage device for various types of electric or electronic apparatus. In addition, the NOR flash memories 100 and 200 can be housed in the same package as another memory, such as a NAND flash memory. In the following, a case in which the NOR flash memory 100 according to the embodiment 1 is used will be described. However, the NOR flash memories according to the embodiments 2 to 4 can also be used in the same way.

Figure 24:
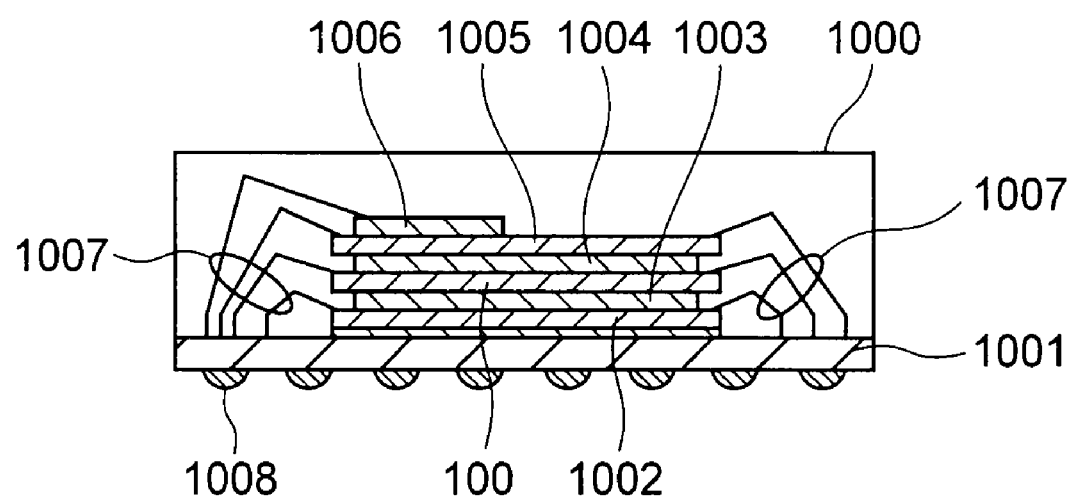
FIG. 24 is a cross-sectional view of an exemplary semiconductor chip 20 incorporating the NOR flash memory 100 described in the embodiment 1 and another memory.

FIG. 24 is a cross-sectional view of an exemplary semiconductor chip (multi chip package: MCP) 20 incorporating the NOR flash memory 100 described in the embodiment 1 and another memory.

As shown in FIG. 24, the semiconductor chip 20 has a substrate 21, and a NAND flash memory 22, a spacer 23, the NOR flash memory 100, a spacer 24, a pseudo static random access memory (PSRAM) 25 and a controller 26 stacked in this order on a substrate 21, which are incorporated in the same package.

The NAND flash memory 22 has a plurality of memory cells capable of storing multivalued data, for example. Alternatively, the semiconductor chip 20 may have a synchronous dynamic random access memory (SDRAM) instead of the PSRAM.

Of the memories described above, depending on the use by the memory system, the NAND flash memory 22 is used as a data storing memory, for example. The NOR flash memory 100 is used as a program storing memory, for example. The PSRAM 25 is used as a work memory, for example.

The controller 26 primarily controls input/output of data to/from the NAND flash memory 22 and manages data in the NAND flash memory 22. The controller 26 has an ECC correcting circuit (not shown), and adds an error-correcting code (ECC) in data writing and performs analysis and processing of an error-correcting code in data reading.

The NAND flash memory 22, the NOR flash memory 100, the PSRAM 25 and the controller 26 are bonded to the substrate 21 by a wire 27.

Each solder ball 28 formed on the back surface of the substrate 21 is electrically connected to the corresponding wire 27. For example, the package is a surface-mounted ball grid array (BGA) in which the solder balls 28 are two-dimensionally arranged.

The ECC correcting circuit 11 in the embodiment 1 may be provided in the NOR flash memory 100 as described above or in the controller 26. In the former case, the NOR flash memory 100 and the NAND flash memory 22 may share one ECC correcting circuit or have their respective ECC correcting circuits. Alternatively, the ECC correcting circuit 11 may be separately provided outside the controller 22.

Next, a case where the semiconductor chip 20 described above is used in a cellular phone, which is an example of the electronic apparatus, will be described.

Figure 25:
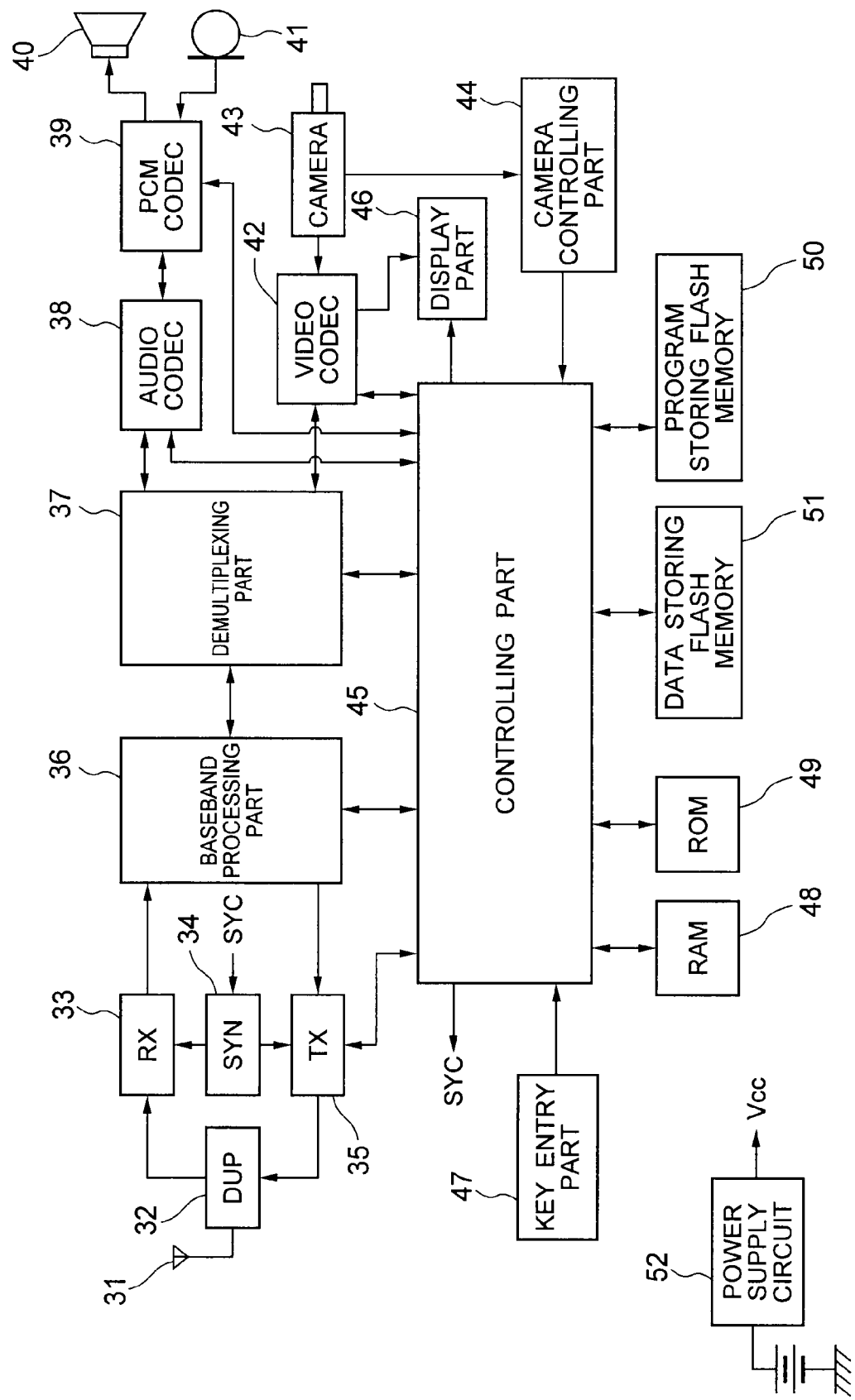
FIG. 25 is a block diagram showing an exemplary internal configuration of a cellular phone of this type.

FIG. 25 is a block diagram showing an exemplary internal configuration of a cellular phone of this type. The cellular phone shown in FIG. 25 has an antenna 31, an antenna duplexer 32 that switches between transmission and reception signals, a receiving circuit 33 that converts a radio signal into a baseband signal, a frequency synthesizer 34 that generates a local oscillation signal for transmission and reception, a transmitting circuit 35 that generates a radio signal by modulating a transmission signal, a baseband processing part 36 that generates a reception signal of a predetermined transmission format based on the base band signal, a demultiplexing part 37 that separates the reception signal into audio, video and text data, an audio codec 38 that decodes the audio data into a digital audio signal, a PCM codec 39 that PCM-decodes the digital audio signal to generates an analog audio signal, a speaker 40, a microphone 41, a video codec 42 that decodes the video data into a digital video signal, a camera 43, a camera controlling part 44, a controlling part 45 that controls the whole of the cellular phone, a display part 46, a key entry part 47, a RAM 48, a ROM 49, a program storing flash memory 50, a data storing flash memory 51 and a power supply circuit 52.

In FIG. 25, the program storing flash memory 50 is the NOR flash memory 100 according to the embodiment 1 described above, and the data storing flash memory 51 is the NAND flash memory 22. The NOR flash memories 200 according to the embodiments 2 to 4 can also be used in the same way.

Data handled in the cellular phone include small data (data having a size of a few words). When such data is stored, the NAND flash memory 22 has to be written in units of one page (512 bytes) each time the data having a size of a few words because of the structure of the NAND memory. Therefore, an unused storage region occurs, and the time required to complete the writing is long.

Thus, the cellular phone shown in FIG. 25 uses a part of the storage region of the NOR flash memory 100, which is originally intended for program storage, to enable data writing in units of one word in the SLC mode. Therefore, the storage region can be efficiently used, and the writing can be performed at high speed.

In particular, in the case of the NOR flash memories 200 according to the embodiments 2 to 4 described above, successive addresses can be externally supplied in data writing, so that a program for data having a size of a few words can be easily created, and the burden on programmers is reduced.

From the above description, those skilled in the art will appreciate additional advantages and be able to devise various modifications. Therefore, the aspects of the present invention are not limited to the embodiments specifically described above. Various additions, modifications, and partial omissions are possible without departing from the concept and spirit of the present invention, which are derived from the contents defined by the claims and equivalents thereto.

What is claimed is:

1. A nonvolatile semiconductor storage device, comprising:
    a plurality of memory cells capable of reading and writing of data;
    a flag storing part that stores flag data indicating which of multivalued data writing and binary data writing is performed for each predetermined cell region, which constitutes a part of the plurality of memory cells; and
    an access range setting part that permits access to the whole of the corresponding cell region based on an external address in a case where the flag data indicates the multivalued data writing and permits access to a half of the corresponding cell region based on successive external addresses in an address range in a case where the flag data indicates the binary data writing.

2. The nonvolatile semiconductor storage device according to claim 1, wherein the access range setting part has an address converting part that rearranges at least a part of a bit sequence constituting an external address in a case where the flag data indicates the binary data writing.

3. The nonvolatile semiconductor storage device according to claim 1, further comprising:
    a parity storing part that stores parity data used for error correction in a case where the flag data indicates the multivalued data writing,
    wherein the flag storing part and the parity storing part are provided in a part of the plurality of memory cells.

4. The nonvolatile semiconductor storage device according to claim 2, further comprising:
    a parity storing part that stores parity data used for error correction in a case where the flag data indicates the multivalued data writing,
    wherein the flag storing part and the parity storing part are provided in a part of the plurality of memory cells.

5. The nonvolatile semiconductor storage device according to claim 1, wherein the size of the cell region in binary data writing is the size of a page, which is a unit of multivalued data writing, or the size of an erase block, which is an unit of data erasure of the plurality of memory cells.

6. The nonvolatile semiconductor storage device according to claim 2, wherein the size of the cell region in binary data writing is the size of a page, which is a unit of multivalued data writing, or the size of an erase block, which is an unit of data erasure of the plurality of memory cells.

7. The nonvolatile semiconductor storage device according to claim 3, wherein the size of the cell region in binary data writing is the size of a page, which is a unit of multivalued data writing, or the size of an erase block, which is an unit of data erasure of the plurality of memory cells.

8. The nonvolatile semiconductor storage device according to claim 4, wherein the size of the cell region in binary data writing is the size of a page, which is a unit of multivalued data writing, or the size of an erase block, which is an unit of data erasure of the plurality of memory cells.

9. The nonvolatile semiconductor storage device according to claim 1, wherein the size of the cell region in binary data writing is any size ranging from the size of a page, which is a unit of multivalued data writing, to the size of the whole of the plurality of memory cells.

10. The nonvolatile semiconductor storage device according to claim 2, wherein the size of the cell region in binary data writing is any size ranging from the size of a page, which is a unit of multivalued data writing, to the size of the whole of the plurality of memory cells.

11. The nonvolatile semiconductor storage device according to claim 3, wherein the size of the cell region in binary data writing is any size ranging from the size of a page, which is a unit of multivalued data writing, to the size of the whole of the plurality of memory cells.

* * * * *